(12) United States Patent
Haase et al.

(10) Patent No.: US 8,748,911 B2
(45) Date of Patent: Jun. 10, 2014

(54) STABLE LIGHT SOURCE

(75) Inventors: Michael A. Haase, St. Paul, MN (US); James A. Thielen, Hugo, MN (US); Catherine A. Leatherdale, Woodbury, MN (US); Billy L. Weaver, Eagan, MN (US); Terry L. Smith, Roseville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 472 days.

(21) Appl. No.: 13/003,491

(22) PCT Filed: Jul. 14, 2009

(86) PCT No.: PCT/US2009/050523
§ 371 (c)(1),
(2), (4) Date: Jan. 10, 2011

(87) PCT Pub. No.: WO2010/009112
PCT Pub. Date: Jan. 21, 2010

(65) Prior Publication Data
US 2011/0108858 A1    May 12, 2011

Related U.S. Application Data

(60) Provisional application No. 61/081,184, filed on Jul. 16, 2008.

(51) Int. Cl.
*H01L 29/18* (2006.01)

(52) U.S. Cl.
USPC .................. 257/88; 257/85; 257/E33.047

(58) Field of Classification Search
USPC ....................... 257/88, 85, E33.047
See application file for complete search history.

(56) References Cited

U.S. PATENT DOCUMENTS

| 4,992,704 | A  | 2/1991 | Stinson |
| 6,747,293 | B2 | 6/2004 | Nitta et al. |
| 7,125,143 | B2 | 10/2006 | Hacker |
| 2005/0242360 | A1 | 11/2005 | Su |

(Continued)

FOREIGN PATENT DOCUMENTS

| EP | 1766692 | 3/2007 |
| JP | H11-145519 | 5/1999 |

(Continued)

OTHER PUBLICATIONS

Speier, Color Temperature Tunable White Light LED System, Proc. of SPIE, vol. 6337, pp. 1-12, (2006).

(Continued)

*Primary Examiner* — Amar Movva
(74) *Attorney, Agent, or Firm* — Yufeng Dong; Daniel J. Iden; Robert S. Moshrefzadeh

(57) ABSTRACT

Light emitting systems are disclosed. The light emitting system emits an output light that has a first color. The light emitting system includes a first electroluminescent device that emits light at a first wavelength in response to a first signal. The first wavelength is substantially independent of the first signal. The intensity of the emitted first wavelength light is substantially proportional to the first signal. The light emitting system further includes a first luminescent element that includes a second electroluminescent device and a first light converting layer. The second electroluminescent device emits light at a second wavelength in response to a second signal. The first light converting layer includes a semiconductor potential well and converts at least a portion of light at the second wavelength to light at a third wavelength that is longer than the second wavelength. The light emitting system combines light at the first wavelength with light at the third wavelength to form the output light at the first color. When one of the first and second signals changes from about 50% of a maximum rating of the signal to about 100% of the maximum rating, but the ratio of the first signal to the second signal remains substantially unchanged, the first color of the output light remains substantially unchanged.

76 Claims, 7 Drawing Sheets

(56) References Cited

U.S. PATENT DOCUMENTS

| | | |
|---|---|---|
| 2006/0081871 A1 | 4/2006 | Streubel |
| 2006/0138435 A1 | 6/2006 | Tarsa |
| 2007/0223219 A1 | 9/2007 | Medendorp, Jr. |
| 2010/0283074 A1 | 11/2010 | Kelley |
| 2011/0101403 A1 | 5/2011 | Haase |

FOREIGN PATENT DOCUMENTS

| | | |
|---|---|---|
| KR | 1020080059989 | 7/2008 |
| WO | WO 2005109532 | 11/2005 |
| WO | WO 2007/146861 A1 | 12/2007 |

OTHER PUBLICATIONS

Tong, "Surface Preparation and Room-Temperature Wafer Bonding" and "Bonding of Structured Wafers", Semiconductor Wafer Bonding, John Wiley & Sons, New York, Chapters 4 and 10, pp. 49-101 and pp. 223-232, (1999).

Int'l Search Report of PCT/US2009/050523, 2 pages.

Written Opinion of PCT/US2009/050523, 4 pages.

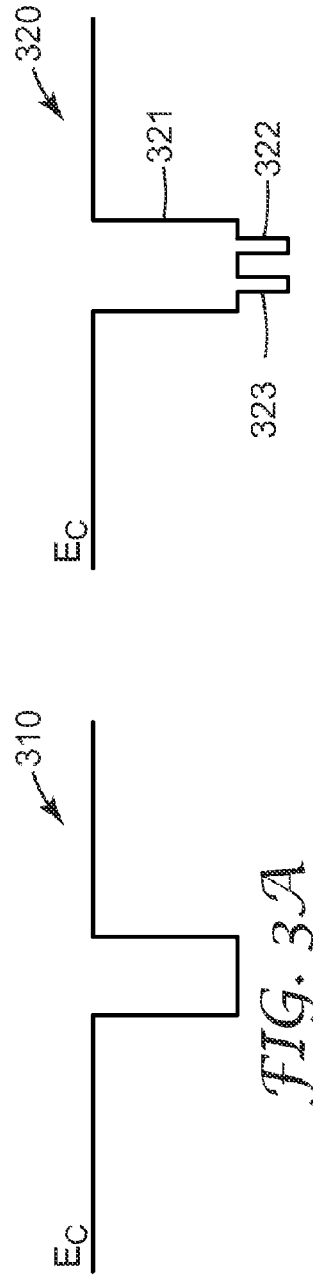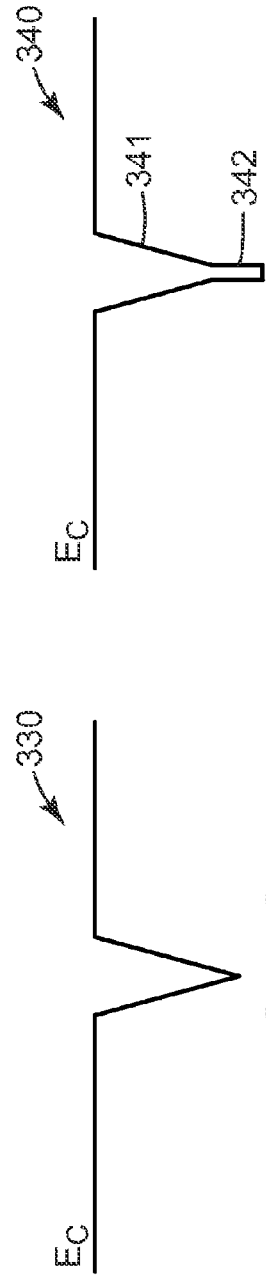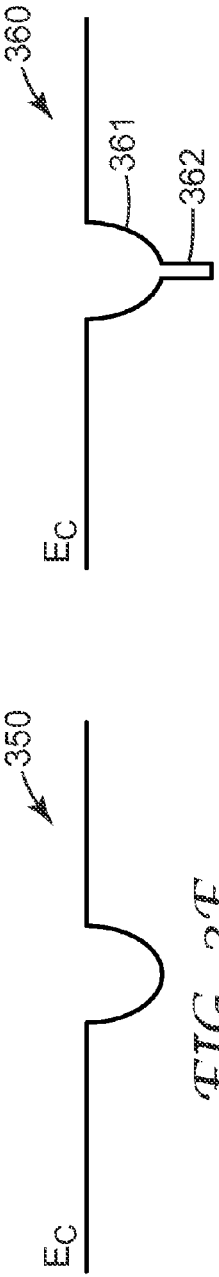

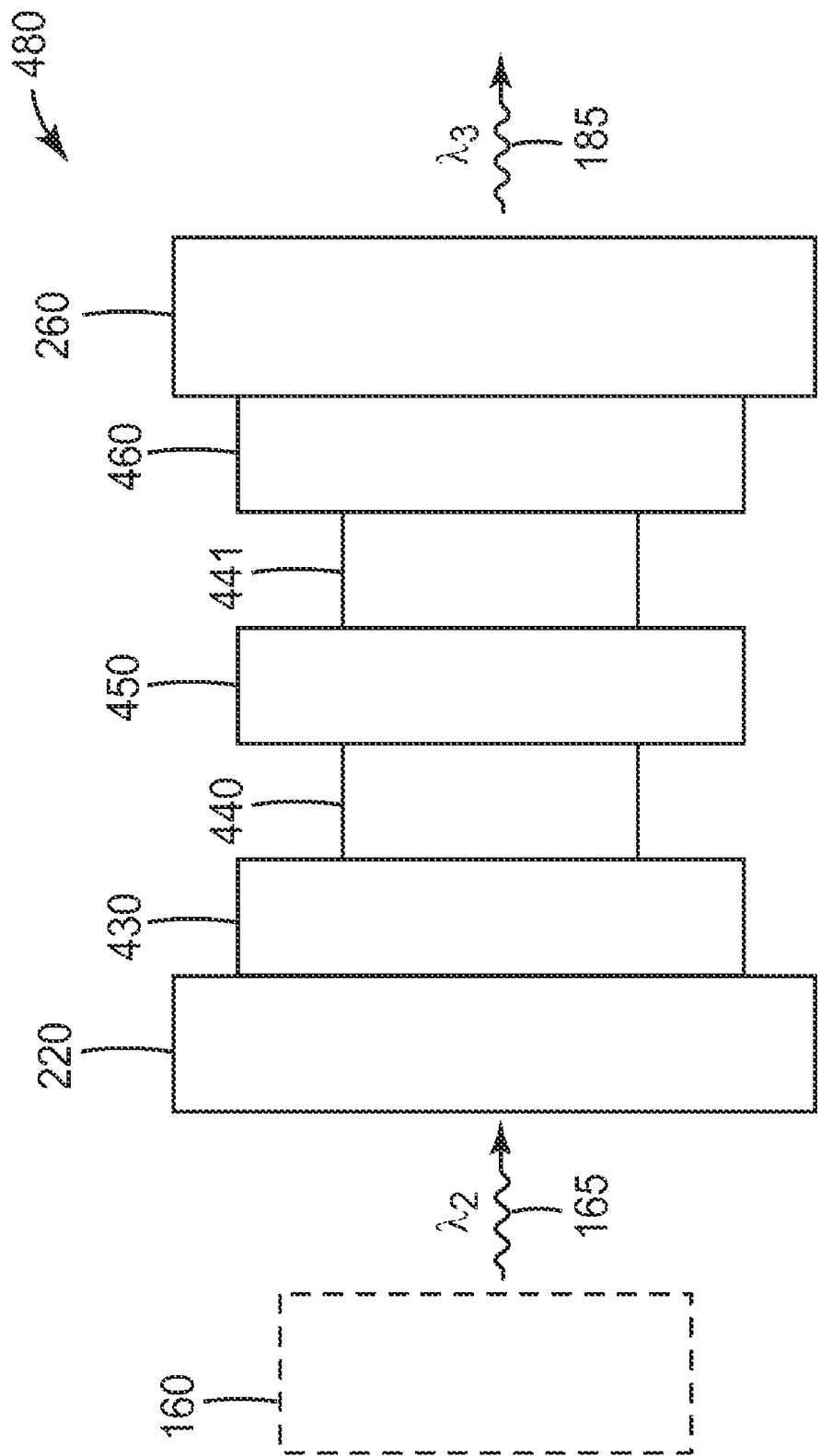

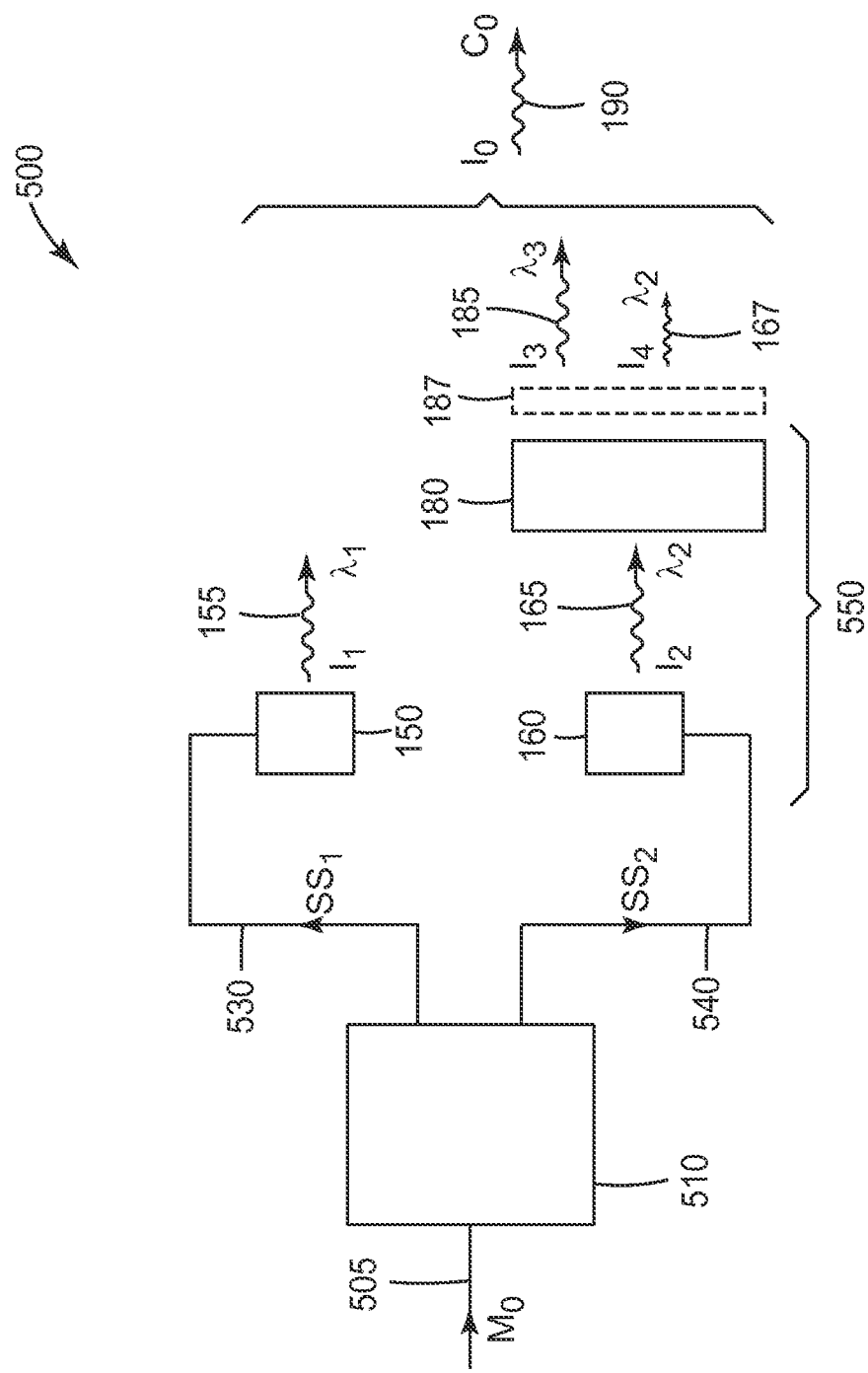

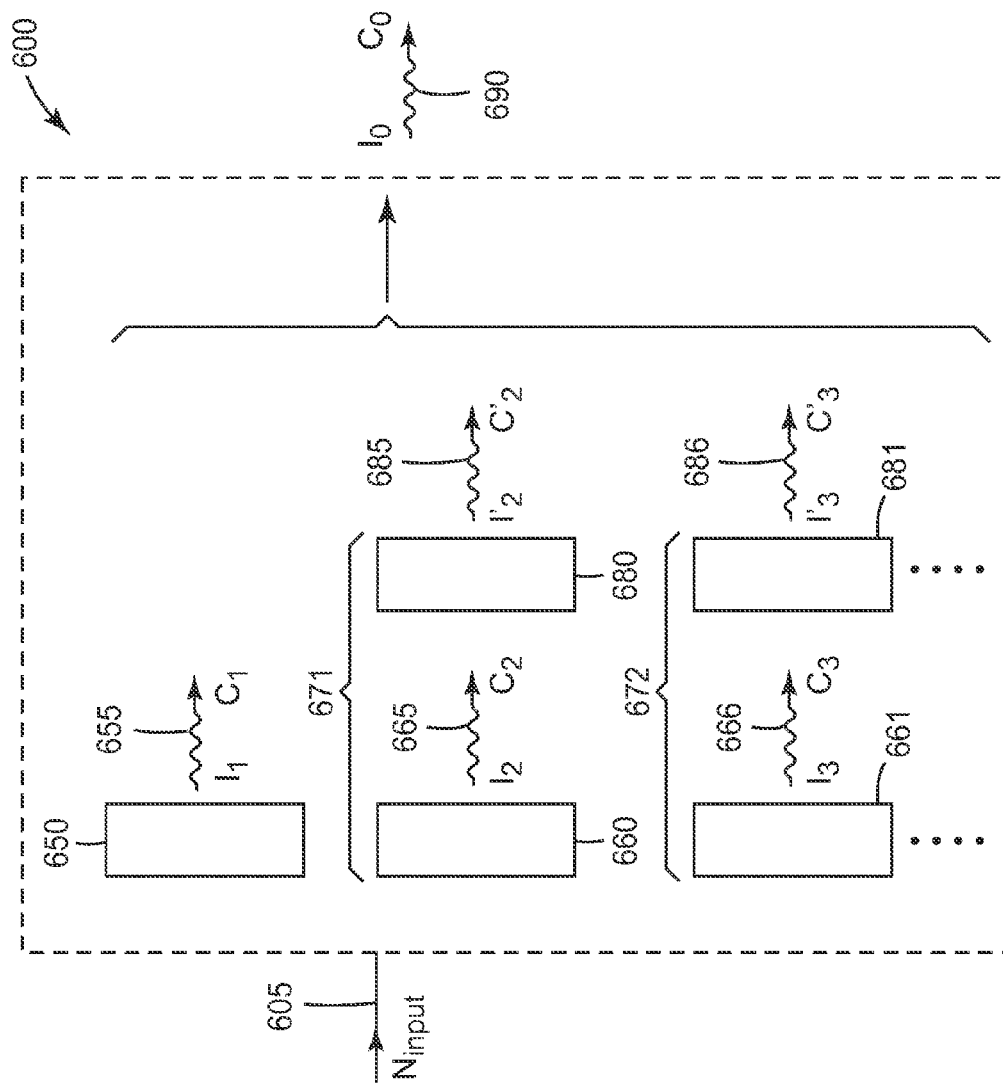

STABLE LIGHT SOURCE

CROSS REFERENCE TO RELATED APPLICATIONS

This application is a national stage filing under 35 U.S.C. 371 of PCT/US2009/050523, filed on Jul. 14, 2009, which claims priority to U.S. Provisional Application No. 61/081,184, filed on Jul. 16, 2008, the disclosure of which is incorporated by reference in its/their entirety herein.

FIELD OF THE INVENTION

This invention generally relates to semiconductor light emitting devices. The invention is particularly applicable to semiconductor light emitting devices having a stable output color.

BACKGROUND

Light emitting devices are used in many different applications, including projection display systems, backlights for liquid crystal displays and the like. Projection systems typically use one or more white light sources, such as high pressure mercury lamps. The white light beam is usually split into three primary colors, red, green and blue, and is directed to respective image forming spatial light modulators to produce an image for each primary color. The resulting primary-color image beams are combined and projected onto a projection screen for viewing.

More recently, light emitting diodes (LEDs) have been considered as an alternative to white light sources. LEDs have the potential to provide the brightness and operational lifetime that would compete with conventional light sources. Current LEDs, however, especially green, yellow and amber emitting LEDs, are relatively inefficient. Furthermore, conventional light sources typically have spectral characteristics that vary as a function of output light intensity. Often, complicated and expensive means are employed to stabilize the spectral characteristics, such as the color, of the emitted light.

SUMMARY OF THE INVENTION

Generally, the present invention relates to semiconductor light emitting devices. In one embodiment, a light emitting system emits an output light that has a first color. The light emitting system includes a first electroluminescent device that emits light at a first wavelength in response to a first signal. The first wavelength is substantially independent of the first signal. The intensity of the emitted first wavelength light is substantially proportional to the first signal. The light emitting system further includes a first luminescent element that includes a second electroluminescent device and a first light converting layer. The second electroluminescent device emits light at a second wavelength in response to a second signal. The first light converting layer includes a semiconductor potential well and converts at least a portion of light at the second wavelength to light at a third wavelength that is longer than the second wavelength. The light emitting system combines light at the first wavelength with light at the third wavelength to form the output light at the first color. When one of the first and second signals changes from about 50% of a maximum rating of the signal to about 100% of the maximum rating, but the ratio of the first signal to the second signal remains substantially unchanged, the first color of the output light remains substantially unchanged.

In another embodiment, a light emitting system emits an output light that has a first color. The light emitting system includes a first electroluminescent device that emits light at a first wavelength and a first luminescent element that includes a second electroluminescent device that emits light at a second wavelength, and a first light converting layer that includes a semiconductor potential well and converts at least a portion of light at the second wavelength to light at a longer third wavelength. The light emitting system combines light at the first and third wavelengths to form the output light having the first color. The light emitting system further includes a controller that receives an input signal and outputs a first signal in response to the control signal for driving the first electroluminescent device and outputs a second signal in response to the control signal for driving the second electroluminescent device. When the control signal changes from about 50% to about 100% of a maximum rating of the control signal but a ratio of the first signal to the second signal remains substantially unchanged, the first color of the output light remains substantially unchanged.

In another embodiment, a light emitting system includes a first LED that emits a first light at a first color in response to an input signal; and a second LED that emits a second light at a second color in response to the input signal; and a light converting layer that includes a II-VI semiconductor potential well and converts at least a portion of the second light to a third light at a third color. The light emitting system outputs light at an output color and an output intensity by combining the first and third lights. A change in the input signal changes the output intensity, but not the output color.

In another embodiment, a light emitting system emits an output light with an output color. The light emitting system includes a main LED that emits light at a main color and N luminescent elements, $N \geq 1$. The ith luminescent element, $i=1$ to N, includes an ith LED that emits light at an ith LED color; and an ith light converting layer that includes a semiconductor potential well and converts at least a portion of light at the ith LED color to light at an ith intermediate color different than the ith LED color. The ith intermediate color is different than the jth intermediate color for i not equal to j. The light emitting system combines light at the main color with lights at the ith intermediate colors, $i=1$ to N, to form the output light with the output color. The light emitting system further includes a controller that receives an input signal and outputs a main signal in response to the input signal for driving the main LED and outputs an ith signal, $i=1$ to N, in response to the input signal for driving the ith LED. When the input signal changes from about 50% to about 100% of the maximum rating of the input signal, but the ratio of the main signal to the ith signal remains substantially unchanged, $i=1$ to N, the output color of the output light remains substantially unchanged.

In another embodiment, a light emitting system includes a first electroluminescent device that emits a first light at a first wavelength $\lambda_1$ in response to a first signal $S_1$, and a first luminescent element that includes a second electroluminescent device that emits a second light at a second wavelength $\lambda_2$ in response to a second signal $S_2$. $\lambda_2$ is different than $\lambda_1$. The first luminescent element further includes a first light converting layer that includes a semiconductor potential well. The first light converting layer converts a portion of the second light to a third light at a third wavelength $\lambda_3$ different than $\lambda_1$ and $\lambda_2$, and transmits a portion of the second light as a fourth light at $\lambda_2$. The light emitting system combines first, third and fourth lights to form an output light that has a first color $C_o$. When one of $S_1$ and $S_2$ signals changes from about 50% of a maximum rating of the signal to about 100% of the maximum rating, but the ratio $S_1/S_2$ remains substantially unchanged, the first color $C_o$ remains substantially unchanged. In some cases, $\lambda_1$ corresponds to a green light, $\lambda_2$ corresponds to a blue light, $\lambda_3$ corresponds to a red light, and the first color $C_o$ corresponds to a white light. In some cases, when one of $S_1$ and $S_2$ signals changes from about 50% of a maximum rating of the signal to about 100% of the maximum rating, the ratio $S_1/S_2$ changes by about 3% or less, and the change $\Delta(u',v')$ in $C_o$ is no more than 0.003, where u' and v' are the CIE color coordinates of color $C_o$.

BRIEF DESCRIPTION OF DRAWINGS

The invention may be more completely understood and appreciated in consideration of the following detailed description of various embodiments of the invention in connection with the accompanying drawings, in which:

FIGS. 3A-3F are schematic representations of exemplary conduction band profiles for a potential well;
FIG. 4 a schematic band diagram of a light converting layer;
FIG. 5 is a schematic side-view of another light emitting system;
FIG. 6 is a schematic side-view of another light emitting system.

The same reference numeral used in multiple figures refers to the same or similar elements having the same or similar properties and functionalities.

DETAILED DESCRIPTION

Figure 1:
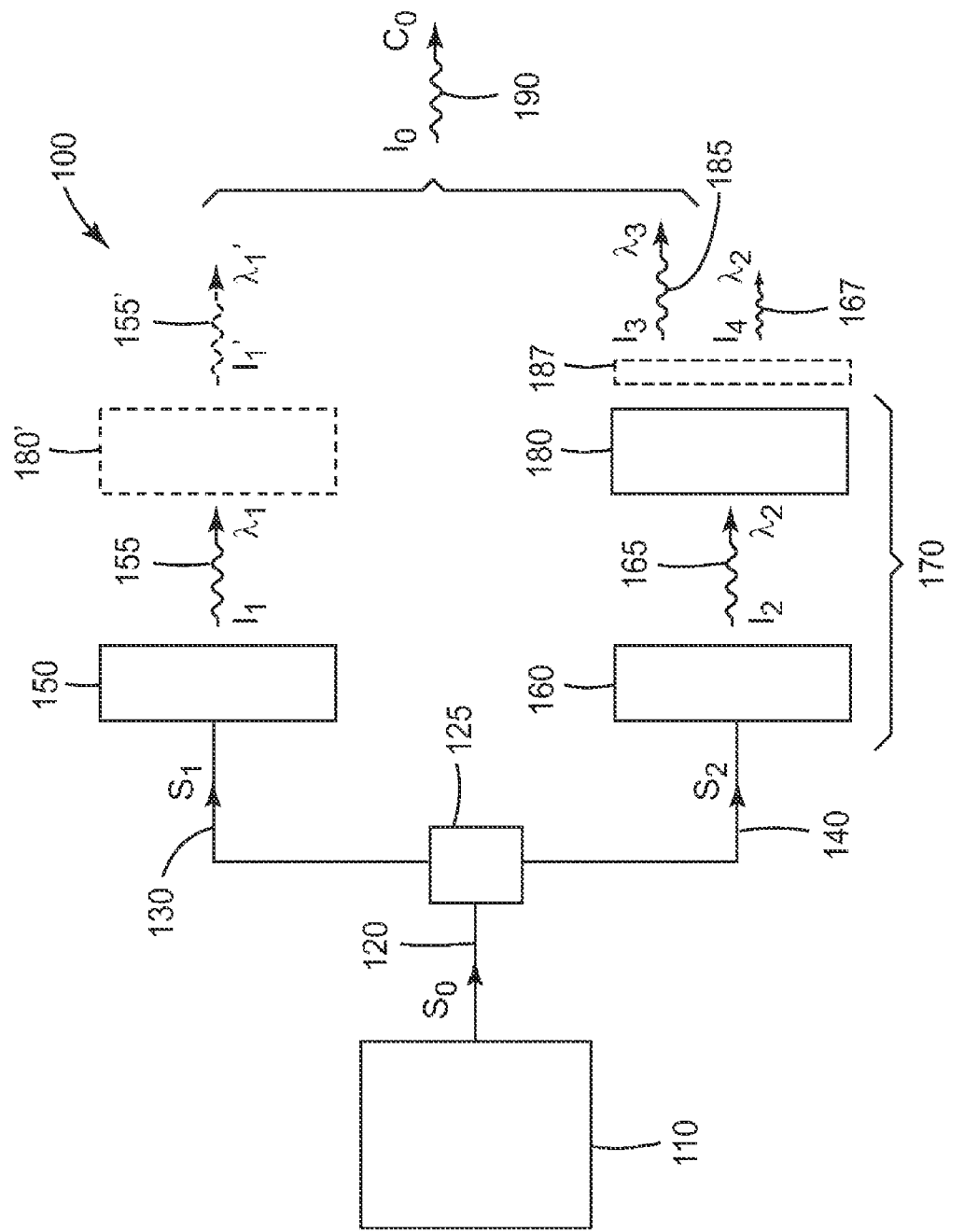
FIG. 1 is a schematic side-view of a light emitting system.

This application discloses semiconductor light emitting devices that include a semiconductor light source and one or more wavelength converters, where the converter can be a semiconductor wavelength converter. In particular, the disclosed devices have spectral characteristics with improved stability. For at least some of the disclosed devices, the emitted output light has improved color stability. For example, the color coordinates of the emitted light remain substantially unchanged for a change in the output intensity. The disclosed stable devices employ stable light sources, such as stable light emitting diodes (LEDs), and stable light converters, such as stable phosphors or semiconductor light converting potential wells. The disclosed devices display improved spectral stability with reduced cost compared to conventional stable light sources, such as compared to semiconductor light sources that employ one or more feedback systems to stabilize the output light color.

Some of the disclosed devices include a stable semiconductor potential well, such as a stable II-VI semiconductor potential well. In some cases, the stable color converters have additional desirable properties such as high conversion efficiency.

Some disclosed devices have a light source and a light converting layer from the same semiconductor group, such as the III-V group. In such cases, it may be feasible to monolithically grow and fabricate, for example, a III-V wavelength converter directly onto a III-V light source, such as a III-V LED. In some cases, however, a wavelength converter with a high conversion efficiency and/or other desirable properties, may be from a semiconductor group that is different than the semiconductor group the LED belongs to. In such cases, it may not be possible or feasible to grow one component onto the other with high quality. For example, a high efficiency stable wavelength converter can be from the II-VI group and a light source, such as an LED, can be from the III-V group. In such cases, various methods can be employed for attaching the light converter to the light source. Some such methods are described in U.S. Patent Application Ser. No. 60/978,304, filed Oct. 8, 2007.

In some applications, it may be desirable to have a spectrally stable light source emitting light at a first wavelength, such as a green wavelength. In such applications, however, such stable light sources may not be available, or they may be available, but may be inefficient, expensive, and/or unacceptably bulky. In such applications, a device disclosed in this application can be advantageously used where the device can include a stable III-V LED emitting light at a first wavelength and a stable II-VI potential well for converting, such as down converting, the light at the first wavelength to light of a second wavelength. In addition to improved stability, the devices disclosed in this application can have other potential advantages, such as high efficiency, low manufacturing cost and/or small size. As used herein, down converting means that the wavelength of the converted light is greater than the wavelength of the unconverted or incident light.

The disclosed light emitting devices can be designed to output, for example, one or more colors, such as one or more primary colors, or white light. The emission efficiency and compactness of the disclosed light emitting devices can lead to new and improved optical systems, such as portable projection systems, with reduced weight, size, and/or power consumption.

In some cases, the disclosed light emitting devices can be used to make a pixelated display by forming an array of pixel-size light sources. In such cases, a displayed image can have spectral characteristics that do not change or change very little for a change in the image brightness.

In some cases, arrays of light emitting devices disclosed in this application can be used in illumination systems, such as adaptive illumination systems, for use in, for example, projection systems or other optical systems.

In some cases, the disclosed light emitting devices can be used as a display backlight, such as a liquid crystal display (LCD) backlight. For example, in some cases, an LCD display can be a zoned display having multiple display zones or regions, where the different zones or regions of the display can be dynamically illuminated according to the desired brightness in each zone. In such cases, one or more light emitting systems disclosed in this application can advantageously be used to illuminate each zone. In general, zoned displays can have the benefit of increasing the contrast of certain zones while, at the same time, decreasing the power usage.

In some cases, the disclosed light emitting devices can be used in general illumination systems, such as in lighting a room. For example, the disclosed devices can be used as part of a free-standing or built-in luminaire controlled with a dimmer switch. In some cases, the disclosed devices can be used for accent lighting to highlight a feature in, for example, a room. For example, the devices can be used to highlight a sculpture, an architectural feature, or a drawing in an art gallery.

In some cases, the disclosed light emitting devices can be used in signage applications such as advertising displays, electronic billboards, channel letters, backlit light boxes, and the like. For example, a disclosed light emitting device may be used to adjust the power that is supplied to a displayed sign depending on such conditions as display time (day vs. night) while, at the same time, minimizing overall power usage.

FIG. 1 is a schematic of a light emitting system 100 that emits an output light 190 that has an intensity $I_o$ and a first color $C_o$ corresponding to CIE color coordinates $u_1'$ and $v_1'$ and color coordinates $x_o$ and $y_o$. Light emitting system 100 includes a primary controller 110, a secondary controller 125, a first electroluminescent device 150, a second electroluminescent device 160 and a first light converting layer 180.

First electroluminescent device 150 emits light 155 at a first wavelength $\lambda_1$ and an intensity $I_1$ in response to a first signal 130 having a value $S_1$. Second electroluminescent device 160 emits light 165 at a second wavelength $\lambda_2$ and an intensity $I_2$ in response to a second signal 140 having a value $S_2$. Signals 130 and 140 are generated when secondary controller 125 receives a control signal 120 having a value $S_o$ from primary controller 110.

In general, first wavelength $\lambda_1$ and second wavelength $\lambda_2$ may or may not be substantially equal. In some cases, wavelengths $\lambda_1$ and $\lambda_2$ may be substantially equal. In such cases, the difference between the two wavelengths may be no more than 15 nm, or no more than 10, or no more than 5 nm, or no more than 3 nm.

In some cases, emitted lights 155 and 165 may be substantially single wavelength lights. In such cases, wavelengths $\lambda_1$ and $\lambda_2$ can be the peak emission wavelengths, each with a full spectral-linewidth at half maximum (FWHM) that is no more than about 50 nm, or no more than about 30 nm, or no more than about 15 nm, or no more than about 10 nm, or no more than about 5 nm. In some cases, one or more of emitted lights 155 and 165 may have a relatively broad emission spectrum. In such cases, the FWHM of the emission spectrum may be at least 50 nm, or at least 70 nm, or at least 100 nm. In the case of a broad spectrum light 155, wavelength $\lambda_1$ can refer to a peak or center wavelength.

In some cases, the first wavelength $\lambda_1$ is substantially independent of the first signal $S_1$, and the light intensity $I_1$ of emitted first wavelength light 155 is substantially proportional to the first signal $S_1$. For example, in such cases, a change in first signal 130 from about 80% to about 100%, or from about 50% to about 100%, of the maximum rating for the first signal, results in a shift of about 10 nm or less, or 8 nm or less, or 5 nm or less, or 3 nm or less, in $\lambda_1$. As another example, in such cases, $I_1$ and $S_1$ substantially satisfy the linear relationship $I_1=k_1 \cdot S_1$, where $k_1$ is a constant real number.

In some cases, the second wavelength $\lambda_2$ is substantially independent of the second signal $S_2$, and the light intensity $I_2$ of the emitted second wavelength light 165 is substantially proportional to the second signal $S_2$. For example, in such cases, a change in second signal 140 from about 80% to about 100%, or from about 50% to about 100%, of the maximum rating for the second signal results in a shift of about 10 nm or less, or 8 nm or less, or 5 nm or less, or 3 nm or less, in $\lambda_2$. As another example, in such cases, $I_2$ and $S_2$ substantially satisfy the linear relationship $I_2=k_2 \cdot S_2$, where $k_2$ is a constant real number. In some cases, $\lambda_2$ depends on the second signal $S_2$ but essentially all light at wavelength $\lambda_2$ is absorbed by the emitting system and does not exit the system. In such cases, the color associated with wavelength $\lambda_2$ or light 165 does not affect the output color $C_o$.

First light converting layer 180 converts at least a portion of light 165 at the second wavelength $\lambda_2$ to light 185 at a third wavelength $\lambda_3$ and intensity $I_3$, where $\lambda_3$ is longer than $\lambda_2$. Light emitting system 100 combines light at wavelength $\lambda_1$ with light at $\lambda_3$ to form output light 190 having first color $C_o$ with CIE color coordinates $u_o'$ and $v_o'$ and color coordinates $x_o$ and $y_o$. In general, color $C_o$ can be any color that may be desirable in an application. In some cases, color $C_o$ can be one of green, yellow, amber, red, magenta, cyan or white. For example, in some cases, $\lambda_1$ can correspond to a green light and $\lambda_2$ can correspond to a blue light. First light converting layer 180 can convert a portion of blue light 165 at $\lambda_2$ to light 185 at wavelength $\lambda_3$ corresponding to a red light, and transmit a portion of blue light 165 as blue light 167 at $\lambda_2$. In such cases, output light 190 can be a combination of unconverted blue light 167, converted red light 185, and LED emitted green light 155, where, in some cases, the combination can result in a white light 190.

In some cases, a small portion of light 165 at $\lambda_2$ is not converted to light at wavelength $\lambda_3$ by light converting layer 180. In such cases, at least a portion of the unconverted light can exit the light converting layer as light 167 at wavelength $\lambda_2$ and intensity $I_4$. In some cases, at least a portion of the unconverted light may be absorbed by an optional light absorbing layer 187 where the light absorbing layer can be substantially optically transmissive at least at wavelength $\lambda_3$. For example, in such cases, light absorbing layer 187 can have an optical transmittance of at least 50%, or at least 60%, or at least 70%, or at least 80%, or at least 90%, or at least 95% at wavelength $\lambda_3$.

In some cases, light absorbing layer 187 can absorb a substantial portion of any unconverted second wavelength light. For example, in such cases, light absorbing layer 187 can have an optical absorbance of at least 1, or at least 2, or at least 3, or at least 4, or at least 5. As another example, in such cases, light absorbing layer 187 absorbs at least 50%, or at least 70%, or at least 90%, or at least 95%, or at least 99%, or at least 99.9% of the unconverted second wavelength light. Examples of light absorbing layer 187 are described in, for example, U.S. Patent Application Ser. No. 61/075,918, filed Jun. 26, 2008.

In some cases, first light converting layer 180 converts substantially all of light 165 at wavelength $\lambda_2$ to light 185 at wavelength $\lambda_3$. For example, in such cases, first light converting layer 180 converts at least 50%, or at least 60%, or at least 70%, or at least 80%, or at least 90%, or at least 95% of light at wavelength $\lambda_2$ to light at wavelength $\lambda_3$.

In general, first and second electroluminescent devices 150 and 160 can be any light source capable of emitting light at a desired wavelength in response to a signal. For example, in some cases, one or both electroluminescent devices 150 and 160 can be LEDs emitting UV, violet or blue light.

In some cases, one or both electroluminescent devices 150 and 160 can include one or more p-type and/or n-type semiconductor layers, one or more active or light emitting layers that can include one or more potential and/or quantum wells, buffer layers, substrate layers, and superstrate layers.

In some cases, one or both electroluminescent devices 150 and 160 can be III-V semiconductor light sources, such as III-V LEDs, and may include AlGaInN semiconductor alloys. For example, one or both electroluminescent devices 150 and 160 can be GaN or ZnO based LEDs. In some cases, an emission spectrum, such as a color spectrum, of a GaN based LED can be substantially independent from the value of the input excitation signal applied to the LED. For example, in cases where first electroluminescent device 150 includes a GaN based LED, when first signal 130 changes from about 80% to about 100%, or from about 50% to about 100%, of the maximum rating of the first signal, each of the CIE color coordinates $u_1'$ and $v_1'$ of light 165 at wavelength $\lambda_1$ changes by no more than 1%, or no more than 0.6%, or no more than 0.5%, or no more than 0.3%, or no more than 0.1%; and the change $\Delta(u_1',v_1')$ in the color point of light 165 is no more than 0.01, or no more than 0.005, or no more than 0.004, or no more than 0.003, or no more than 0.002, or no more than 0.001.

In general, each of control signal 120, first signal 130 and second signal 140, has a maximum rating under normal operating conditions. For example, each of the signals can be a current or a voltage with a maximum rating. In some cases, such as when each of first and second electroluminescent devices 150 and 160, respectively, includes a GaN based LED and first light converting layer 180 includes one or more II-VI potential wells, when control signal 120 changes from about 80% of the maximum rating of the signal to about 100% of the maximum rating of the signal or from about 50% of the maximum rating of the signal to about 100% of the maximum rating of the signal, but a ratio of the first signal 130 to second signal 140 (that is, the ratio $S_1/S_2$) remains substantially unchanged, first color $C_o$ of output light 190 remains substantially unchanged. For example, in such cases, when $S_o$ changes from about 50% to about 100% of the maximum rating of $S_o$; but the ratio $S_1/S_2$ changes by about 5% or less, or about 3% or less, or about 1% or less, or about 0.5% or less, or about 0.1% or less, or about 0.01% or less; each of color coordinates $u_o'$ and $v_o'$ of color $C_o$ changes by no more than 0.01, or no more than 0.005, or no more than 0.004, or no more than 0.003, or no more than 0.002, or no more than 0.001; and the change $\Delta(u_o',v_o')$ in $C_o$ is no more than 0.01, or no more than 0.005, or no more than 0.004, or no more than 0.003, or no more than 0.002, or no more than 0.001. As another example, in such cases, when $S_o$ changes from about 50% to about 100% of its maximum rating and the ratio of the first signal to the second signal changes by about 1% or less, each of the color coordinates $u_o'$ and $v_o'$ of $C_o$ changes by no more than 0.01, or no more than 0.005, or no more than 0.004, or no more than 0.003, or no more than 0.002, or no more than 0.001; and the change $\Delta(u_o',v_o')$ in $C_o$ is no more than 0.01, or no more than 0.005, or no more than 0.004, or no more than 0.003, or no more than 0.002, or no more than 0.001.

In general, the location of color point $C_o$ in the color space depends, at least in part, on the intensity $I_1$ of light output of first electroluminescent device 150 and intensity $I_3$ of light output of luminescent element 170. In some cases, such as when intensity $I_4$ of light 167 is insignificant relative to intensities $I_1$ and $I_3$ or in cases where $\lambda_1$ and $\lambda_2$ are substantially equal, color point $C_o$ is a linear function of the color points of output light 155 at $\lambda_1$ having intensity $I_1$ and output light 185 at $\lambda_3$ having intensity $I_3$. In such cases, the location of the color point $C_o$ is on a color line connecting the color points of lights 155 and 185. In such cases, color $C_o$ is substantially a fixed color point, meaning that the individual intensities $I_1$ and $I_3$ may change, for example, as control signal $S_o$ is changed, but the ratio $I_1/I_3$ remains substantially unchanged.

In some cases, output light 190 can correspond to a primary color, such as blue, green, or red in the RGB primary color system or cyan, magenta, and yellow in the CMYK primary color system. In some cases, output light 190 is not a primary color. For example, in such cases, the output color $C_o$ can amber, magenta or white.

In some cases, light converting layer 180 can be capable of converting at least a portion of light 165 at second wavelength $\lambda_2$ to light 185 at wavelength $\lambda_3$ by absorbing at least a portion of the second wavelength light and re-emitting at least a portion of the absorbed light as the third wavelength light, where the third wavelength $\lambda_3$ is longer than the second wavelength $\lambda_2$.

First light converting layer 180 can include any layer capable of converting at least a portion of light 165 at the second wavelength to light 185 at the third wavelength. For example, light converting layer 180 can include a phosphor (a phosphorescent material), a fluorescent dye, a conjugated light emitting organic material such as a polyfluorene, a potential well, a quantum well, or a quantum dot. Exemplary phosphors that may be used as a light converting layer include strontium thiogallates, doped GaN, copper-activated zinc sulfide, silver-activated zinc sulfide, silicate based phosphors, and aluminate based phosphors.

Inorganic potential and quantum wells, such as inorganic semiconductor potential and quantum wells, typically have increased light conversion efficiencies and are more reliable by being less susceptible to environmental elements such as moisture. Furthermore, inorganic potential and quantum wells tend to have a narrower output spectrum resulting in, for example, improved color gamut.

Figure 2:
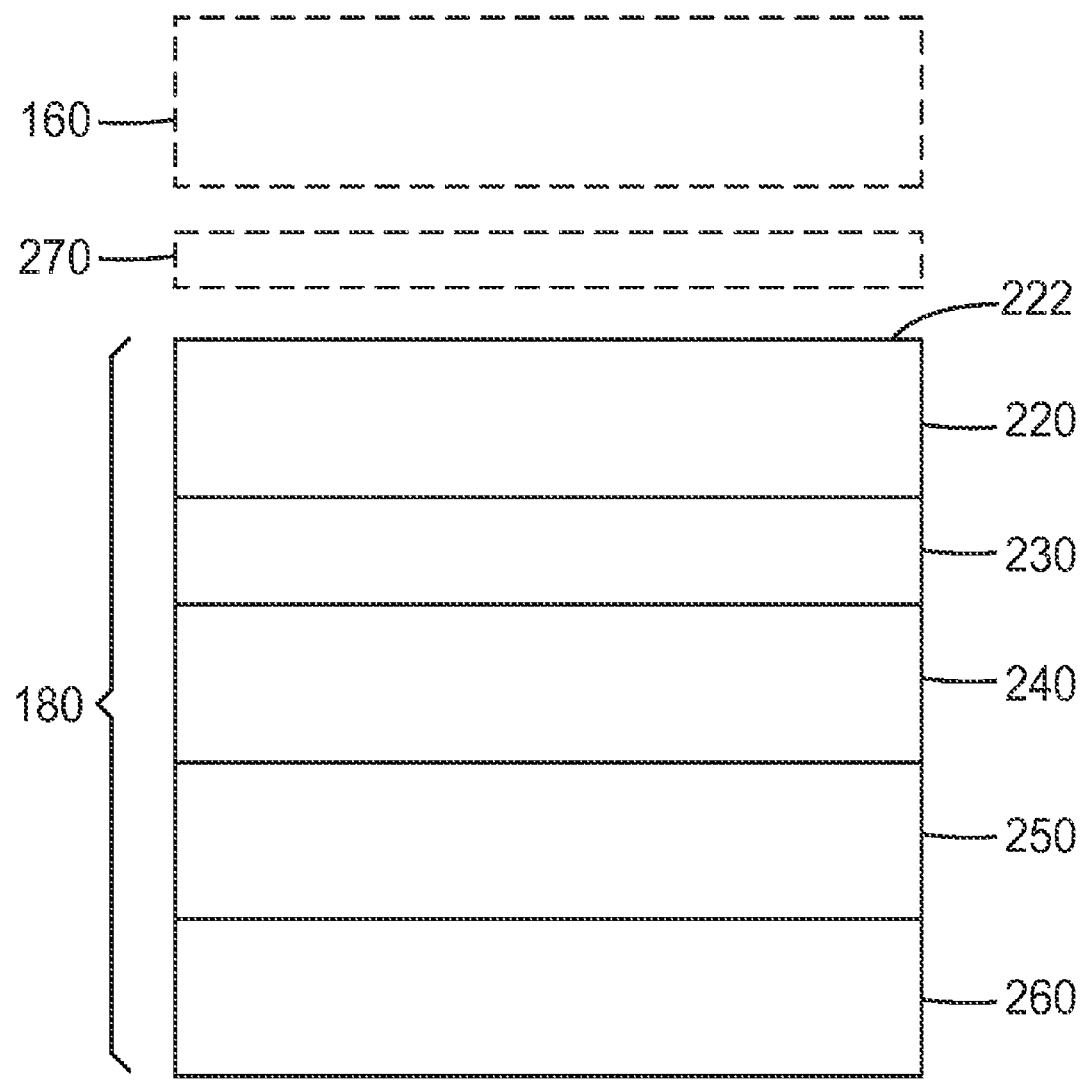
FIG. 2 is a schematic side-view of a light converting layer.

FIG. 2 is a schematic of exemplary layers that can be included in light converting layer 180. Exemplary converting layer 180 includes first and second windows 220 and 260, respectively, first and second light absorbing layers 230 and 250, respectively, and a potential well 240 as a re-emitting layer. In some cases, light converting layer 180 includes at least one layer of a II-VI compound. For example, in such cases, re-emitting layer or potential well 240 can include one or more II-VI potential wells capable of converting at least a portion of a light, such as a UV, violet or blue light that is emitted by LED 160, to a longer wavelength, such as a green or red, light.

As used herein, potential well means semiconductor layer(s) in a multilayer semiconductor structure designed to confine a carrier in one dimension only, where the semiconductor layer(s) has a lower conduction band energy than the surrounding layers and/or a higher valence band energy than the surrounding layers. Quantum well generally means a potential well which is sufficiently thin that quantization effects increase the energy for electron-hole pair recombination in the well. A quantum well typically has a thickness of about 100 nm or less, or about 10 nm or less.

In some cases, a potential or quantum well or a re-emitting layer 240 includes a II-VI semiconductor potential or quantum well that has a band gap energy that is smaller than the energy of a photon emitted by second electroluminescent device 160. In general, the transition energy of a potential or quantum well 240 is substantially equal to the energy of a photon that is re-emitted by the potential or quantum well.

In some cases, potential well or re-emitting layer 240 can include CdMgZnSe alloys having compounds ZnSe, CdSe, and MgSe as the three constituents of the alloy. In some cases, one or more of Cd, Mg, and Zn, especially Mg, may be absent from the alloy. For example, potential well or re-emitting layer 240 can include a $Cd_{0.70}Zn_{0.30}Se$ quantum well capable of re-emitting in the red, or a $Cd_{0.33}Zn_{0.67}Se$ quantum well capable of re-emitting in the green. As another example, potential well or re-emitting layer 240 can include an alloy of Cd, Zn, Se, and optionally Mg, in which case, the alloy system can be represented by Cd(Mg)ZnSe. As another example, potential well or re-emitting layer 240 can include one or more alloys of Cd, Mg, Se, and optionally Zn. In some cases, the potential well can include ZnSeTe. In some cases, a quantum well or re-emitting layer 240 has a thickness in a range from about 1 nm to about 100 nm, or from about 2 nm to about 35 nm.

In some cases, first light converting layer 180 can include additional layers not shown explicitly in FIG. 2. For example, first light converting layer 180 can include a semiconductor, such as a II-VI semiconductor, strain-compensation layer for compensating or alleviating strain in potential well 240. A strain-compensation layer can, for example, be placed in between the potential well and first absorbing layer 230 and/or second absorbing layer 250. A strain-compensation layer can include, for example, ZnSSe and/or BeZnSe.

In general, potential well 240 can have any conduction and/or valence band profile. Some exemplary conduction band profiles for a potential well are shown schematically in FIGS. 3A-3F where $E_C$ denotes the conduction band energy. In particular, a potential well 310 shown in FIG. 3A has a square or rectangular profile; a potential well 320 shown in FIG. 3B has a first rectangular profile 321 combined with a second rectangular profile 322 and a third rectangular profile 323; a potential well 330 shown in FIG. 3C has a linearly graded profile; a potential well 340 shown in FIG. 3D has a linearly graded profile 341 combined with a rectangular profile 342; a potential well 350 shown in FIG. 3E has a curved, such as a parabolic, profile; and a potential well 360 shown in FIG. 3F has a parabolic profile 361 combined with a rectangular profile 362.

In some cases, potential well or re-emitting layer 240 can be n-doped or p-doped where the doping can be accomplished by any suitable method and by inclusion of any suitable dopant, such as for example, chlorine or iodine. In some cases, the number density of the dopant is in a range from about $10^{17}$ cm$^{-3}$ to about $10^{18}$ cm$^{-3}$. Other exemplary dopants include Al, Ga, In, F, Br, and N.

In some cases, second electroluminescent device 160 and first light converting layer 180 can be from two different semiconductor groups. For example, in such cases, second electroluminescent device 160 can be a III-V semiconductor device and first light converting layer 180 can be a II-VI semiconductor device. In some cases, second electroluminescent device 160 can include AlGaInN semiconductor alloys and first light converting layer 180 can include Cd(Mg)ZnSe semiconductor alloys where a material enclosed in parentheses is an optional material.

In some cases, first light converting layer 180 and/or light emitting system 100 can have a single potential well. In some cases, first light converting layer 180 and/or light emitting system 100 can have multiple potential wells. For example, in some cases, first light converting layer 180 can have at least 2 potential wells, or at least 5 potential wells, or at least 10 potential wells, where, in some cases, each potential well is disposed between, and closely adjacent to, two light absorbing layers.

First and second light absorbing layers 230 and 250 are proximate potential well 240 to assist in absorbing light emitted from electroluminescent device 160. In some cases, the absorbing layers are sufficiently close to potential well 240 so that a photo-generated carrier within the light absorbing layers, can efficiently diffuse to the potential well. In some cases, the light absorbing layers can include a semiconductor, such as an inorganic semiconductor, such as a II-VI semiconductor. For example, at least one of absorbing layers 230 and 250 can include a Cd(Mg)ZnSe semiconductor alloy. In some cases, all or at least portions of respective first and second light absorbing layers 230 and 250 can be n-doped or p-doped where the doping can be accomplished by any suitable method and by inclusion of any suitable dopant, for example, chlorine or iodine. In some cases, the number density of the dopant is in a range from about $10^{17}$ cm$^{-3}$ to about $10^{18}$ cm$^{-3}$. Other exemplary dopants include Al, Ga, In, F, Br and N.

In some cases, a light absorbing layer has a band gap energy that is smaller than the energy of a photon emitted by second electroluminescent device 160. In such cases, the light absorbing layer can strongly absorb light that is emitted by the light source. In some cases, a light absorbing layer has a band gap energy that is greater than the transition energy of potential well 240. In such cases, the light absorbing layer is substantially optically transparent to light that is re-emitted by the potential well.

In some cases, at least one of light absorbing layers 230 and 250 can be closely adjacent to potential well 240, meaning that one or a few intervening layers may be disposed between the absorbing layer and the potential well. In some cases, at least one of light absorbing layers 230 and 250 can be immediately adjacent to potential well 240, meaning that no intervening layer is disposed between the absorbing layer and the potential well.

The exemplary first light converting layer 180 in FIG. 2 includes two light absorbing layers 230 and 250. In general, a light converting layer can have no, one, two, or more than two light absorbing layers. In general, a light absorbing layer is sufficiently close to potential well 240 so that a photo-generated carrier within the light absorbing layer has a reasonable chance of diffusing to the potential well. In some cases, the sum of the thicknesses of all of the light absorbing layers in first light converting layer 180 is sufficiently large to absorb a substantial portion, such as at least 60%, or at least 70%, or at least 80%, or at least 90%, of light 165.

First and second windows 220 and 260 are designed primarily to provide barriers so that carriers, such as electron-hole pairs, that are photo-generated in an absorbing layer do not, or have a small chance to, migrate to a free or external surface, such as surface 222, of first light converting layer 180. For example, first window 220 is designed primarily to prevent carriers generated in first absorbing layer 230 by light emitted by LED 160, from migrating to surface 222 where they can recombine non-radiatively. In some cases, windows 220 and 260 have band gap energies that are greater than the energy of a photon emitted by LED 160. In such cases, windows 220 and 260 are substantially optically transparent to light emitted by LED 160 and light re-emitted by potential well 240.

The exemplary first light converting layer 180 of FIG. 2 includes two windows. In general, a light converting layer can have no, one, two or more windows. For example, in some cases, first light converting layer 180 can have a single window disposed between LED 160 and potential well 240, or between LED 160 and absorbing layer 230.

In some cases, the location of an interface between two adjacent layers in light converting layer 180 may be a well-defined or sharp interface. In some cases, such as when the material composition within a layer changes as a function of distance along the thickness direction, the interface between two adjacent layers may not be well defined and may, for example, be a graded interface. For example, in some cases, first absorbing layer 230 and first window 220 can have the same material components but with different material concentrations. In such cases, the material composition of the absorbing layer may be gradually changed to the material composition of the window layer resulting in a graded interface between the two layers. For example, in cases where both layers include Mg, the concentration of Mg can be increased when gradually transitioning from the absorbing layer to the window.

The exemplary light converting layer 180 includes a single potential well 240 located between two absorbing layers 230 and 250. In general, a layer, such as layer 230, situated on a side of a potential well, may or may not absorb light 165 at the second wavelength $\lambda_2$ emitted by light source 160. In general, light converting layer 180 can have one or more potential wells where each potential well is placed between two layers with larger band gap energies. For example, FIG. 4 is a schematic of a light converting layer 480 that includes two potential wells 440 and 441. Potential well 440 is placed between layers 430 and 450 each having a larger band gap energy than potential well 440, and potential well 441 is placed between layers 450 and 460 each having a larger band gap energy than potential well 441. In general, a primary function of layers 430, 450 and 460 is to confine carriers in the corresponding potential well(s). In some cases, layers 430, 450 and 460 are not capable of absorbing light 165 at the second wavelength. In such cases, the band gap energies of these layers are larger than the second photon energy of light at $\lambda_2$. In some cases, one or more of layers 430, 450 and 460 may be capable of absorbing light 165 at the second wavelength. In such cases, the light absorbing layer has a band gap energy that is smaller than the second photon energy but larger than the transition energy of the corresponding potential well(s).

In the exemplary light emitting system 100 of FIG. 1, light absorbing layer 187 is distinct and separate from, or external to, first light converting layer 180. In general, light absorbing layer 187 may or may not be included in first light converting layer 180. For example, in some cases, first and second light absorbing layers 230 and 250 may provide the necessary absorption of light emitted by LED 160. As another example, in some cases, light absorbing layers 430, 450 and 460 may provide the necessary absorption of light emitted by LED 160.

Referring back to FIG. 1, in some cases, the first and second electroluminescent devices can have substantially identical optical and electrical characteristics. For example, in such cases, all the potential or quantum wells in LED based electroluminescent devices are made of the same semiconductor alloy. For example, for blue LEDs, the potential wells are all made of GaInN. As another example, all the potential or quantum wells in the LEDs have substantially the same thickness. In such cases, the variation among the thicknesses of the potential or quantum wells is no more than 50%, or no more than 40%, or no more than 30%, or no more than 20%, or no more than 10%, or no more than 5%. As yet another example, all the electroluminescent devices, such as LEDs, in light emitting system 100 are made of the same material systems using the same fabrication processes. As another example, in some cases, such as when the electroluminescent devices are LEDs, the devices have the same construction and are fabricated on the same wafer or substrate. As yet another example, the first and second electroluminescent devices may have substantially the same forward voltage for a given drive current. For example, for a given drive current, the difference between the forward voltages in the LEDs is no more than 10%, or no more than 5%, or no more than 1%. As another example, in cases where the same drive current is applied to the electroluminescent devices, as the drive current changes across the normal operating range of the drive current, the forward voltages remain substantially equal. In such cases, as the input current signal for the two LEDs changes across the normal operating range of the input signal, each of the respective forward voltages can change appreciably, but the difference between the forward voltages remains less than 10%, or less than 5%, or less than 1%.

In some cases, for $S_1=S_2$, the ratio of the output optical power of the first electroluminescent device $P_1(S_1)$, to the output optical power of the second electroluminescent device $P_2(S_2)$ (that is, $P_1(S_1)/P_2(S_2)$), is substantially independent from the drive signals $S_1$ & $S_2$ in a range from about 80% to about 100%, or from about 50% to about 100%, of the maximum rating for the drive signals. For example, in such cases, as $S_1$ changes from about 50% to about 100% of the maximum rating for $S_1$, the ratio $P_1(S_1)/P_2(S_2)$ changes by no more than 10%, or no more than 5%, or no more than 1%.

In some cases, the first and second LED electroluminescent devices have substantially identical optical and electrical characteristics when they come from the same bin or LED grouping where the grouping is based on, for example, efficiency, peak wavelength and/or forward voltage. For example, in such cases, the first and second LED electroluminescent devices are from the same bin where the wavelength range of the LEDs in the bin is no more than 5 nm, or no more than 3 nm.

In some cases, second electroluminescent device 160, such as an LED 160, can be detached from first light converting layer 180 as shown schematically in FIG. 1. In some cases, it may be desirable to attach the two components. In general, second electroluminescent device 160 can be attached or bonded to first light converting layer 180 by any suitable method such as by an adhesive 270 (FIG. 2) such as a hot melt adhesive, welding, pressure, heat or any combinations of such methods or other methods that may be desirable in an application as described, for example, in U.S. Patent Application Ser. No. 60/978,304, filed Oct. 8, 2007. Examples of suitable hot melt adhesives include semicrystalline polyolefins, thermoplastic polyesters, and acrylic resins.

Other exemplary bonding materials include optically clear polymeric materials, such as optically clear polymeric adhesives, including acrylate-based optical adhesives, such as Norland 83H (supplied by Norland Products, Cranbury N.J.); cyanoacrylates such as Scotch-Weld instant adhesive (supplied by 3M Company, St. Paul, Minn.); benzocyclobutenes such as Cyclotene™ (supplied by Dow Chemical Company, Midland, Mich.); clear waxes such as CrystalBond (Ted Pella Inc., Redding Calif.); liquid, water, or soluble glasses based on Sodium Silicate; and spin-on glasses (SOG).

In some cases, a semiconductor LED 160 can be attached to a semiconductor light converting layer 180 by a wafer bonding technique described in, for example, chapters 4 and 10 of "Semiconductor Wafer Bonding" by Q.-Y. Tong and U. Gösele (John Wiley & Sons, New York, 1999).

In some cases, light emitting system 100 can include a second light converting layer 180' that receives light at the first wavelength $\lambda_1$ and converts at least a portion of the received light to light 155' at wavelength $\lambda_1'$. In such cases, the combination of electroluminescent device 150 and light converting layer 180' forms a luminescent element that emits light 155' at $\lambda_1'$ in response to the first signal $S_1$. In such cases, output light 190 of the light emitting system has a color $C_o$ and can be a combination of light 185 at the third wavelength $\lambda_3$ and light 155' at wavelength $\lambda_1'$.

In some cases, the output light of light converting layer 180' is substantially at wavelength $\lambda_1'$. In such cases, the output spectrum of the combination of electroluminescent device 150 and light converting layer 180' can be centered at wavelength $\lambda_1'$ and, in some cases, can have a small FWHM, such as a FWHM that is no more than about 50 nm, or no more than about 30 nm, or no more than about 15 nm, or no more than about 10 nm, or no more than about 5 nm. In such cases, light converting layer 180' blocks a substantial portion of light 155, where the blocking can be achieved by, for example, reflection, conversion, absorption, or any combination thereof. For example, in such cases, light converting layer 180' blocks at least 90%, or at least 95%, or at least 97%, or at least 99%, or at least 99.5% of light 155.

In some cases, first light converting layer 180 converts a portion of light 165 at $\lambda_2$ to light 185 at the third wavelength $\lambda_3$ and transmits a portion of light 165 as light 167 at $\lambda_2$. In such cases, output light 190 of the light emitting system has a color $C_o$ and can be a combination of light 185 at wavelength $\lambda_3$, light 167 at wavelength $\lambda_2$, and light 155' at wavelength $\lambda_1'$. In some cases, when one of respective first and second signals 130 ($S_1$) and 140 ($S_2$) changes from about 80%, or from about 50%, of the maximum rating of the signal to about 100% of the maximum rating, but the ratio $S_1/S_2$ remains substantially unchanged, the first color $C_o$ remains substantially unchanged. For example, when one of the signals changes from about 50% of the maximum rating of the signal to about 100% of the maximum rating, the ratio $S_1/S_2$ changes by about 3% or less, and the change $\Delta(u',v')$ in $C_o$ is no more than 0.003.

In some cases, wavelengths $\lambda_1$ and $\lambda_2$ belong to the same color range in the visible spectrum. For example, in some cases, each of wavelengths $\lambda_1$ and $\lambda_2$ corresponds to a blue light. In some cases, the difference between wavelengths $\lambda_1$ and $\lambda_2$ is no more than about 70 nm, or about 60 nm, or about 50 nm, or about 40 nm, or about 30 nm, or about 20 nm, or about 10 nm, or about 7 nm, or about 5 nm.

In some cases, each of wavelengths $\lambda_1$ and $\lambda_2$ can correspond to a blue light, wavelength $\lambda_1'$ can correspond to a green light, $\lambda_3$ can correspond to a red light, and the first color $C_o$ can correspond to a white light.

FIG. 5 is a schematic of a light emitting system 500 that emits an output light 190 that has an intensity $I_o$ and a first color $C_o$ corresponding to CIE color coordinates $u_o'$ and $v_o'$. Light emitting system 500 includes a controller 510, first electroluminescent device 150, and a first luminescent device 550 that includes second electroluminescent device 160 and first light converting layer 180.

First electroluminescent device 150 emits light 155 at first wavelength $\lambda_1$ and intensity $I_1$ in response to a first signal 530 having a value $SS_1$. Second electroluminescent device 160 emits light 165 at second wavelength $\lambda_2$ and intensity $I_2$ in response to a second signal 540 having a value $SS_2$. Signals 530 and 540 are generated when controller 510 receives an input signal 505 having a value $M_o$.

In some cases, controller 510 receives input signal $M_o$ and, in response, outputs first signal 530 for driving first electroluminescent device 150, and outputs second signal 540 for driving second electroluminescent device 160.

In general, the first wavelength $\lambda_1$ and the second wavelength $\lambda_2$ may or may not be substantially equal. In some cases, wavelengths $\lambda_1$ and $\lambda_2$ may be substantially equal. For example, in such cases, the difference between the two peak wavelengths may be no more than 15 nm, or no more than 10, or no more than 5 nm.

In some cases, the first wavelength $\lambda_1$ is substantially independent of the first signal $SS_1$, and the light intensity $I_1$ of emitted first wavelength light 155 is substantially proportional to the first signal $SS_1$. For example, in such cases, a change in first signal 530 from about 80% to about 100%, or from about 50% to about 100%, of the maximum rating of the signal, results in a change of about 1% or less, or about 0.5% or less, or about 0.1% or less, or about 0.01% or less, in $\lambda_1$. As another example, in such cases, $I_1$ and $SS_1$ substantially satisfy the linear relationship $I_1=k_{11} \cdot SS_1$, where $k_{11}$ is a constant real number.

In some cases, the second wavelength $\lambda_2$ is substantially independent of the second signal $SS_2$, and the light intensity $I_2$ of emitted second wavelength light 165 is substantially proportional to the second signal $SS_2$. For example, in such cases, a change in second signal 540 from about 80% to about 100%, or from about 50% to about 100%, of the maximum rating of the signal, results in a change of about 1% or less, or about 0.5% or less, or about 0.1% or less, or about 0.01% or less, in $\lambda_2$. As another example, in such cases, $I_2$ and $SS_2$ substantially satisfy the linear relationship: $I_2=k_{22} \cdot SS_2$, where $k_{22}$ is a constant real number.

First light converting layer 180 converts at least a portion of light 165 at the second wavelength $\lambda_2$ to light 185 at third wavelength $\lambda_3$ and intensity $I_3$, where $\lambda_3$ is longer than $\lambda_2$. Light emitting system 500 combines light at wavelength $\lambda_1$ with light at $\lambda_3$ to form output light 190 having first color $C_o$ with CIE color coordinate $u_o'$ and $v_o'$. In general, color $C_o$ can be any color that may be desirable in an application. In some cases, color $C_o$ can be one of green, yellow, amber, red, and white.

In some cases, first light converting layer 180 converts substantially all of light 165 at wavelength $\lambda_2$ to light 185 at wavelength $\lambda_3$. In some cases, first light converting layer 165 converts at least 50%, or at least 60%, or at least 70%, or at least 80%, or at least 90%, or at least 95% of light at wavelength $\lambda_2$ to light at wavelength $\lambda_3$.

In some cases, a small portion of light 165 at $\lambda_2$ is not converted to light at wavelength $\lambda_3$ by light converting layer 180. In such cases, at least a portion of the unconverted light may exit the light converting layer as light 167 at wavelength $\lambda_2$ and intensity $I_4$. In some cases, at least a portion of the unconverted light may be absorbed by optional light absorbing layer 187 where the light absorbing layer is substantially optically transmissive at least at wavelength $\lambda_3$.

In some cases, light absorbing layer 187 can absorb a substantial portion of any unconverted second wavelength light. For example, in such cases, light absorbing layer 187 has an optical absorbance of at least 1, or at least 2, or at least 3, or at least 4, or at least 5.

In some cases, one or both electroluminescent devices 150 and 160 can include one or more p-type and/or n-type semiconductor layers, one or more active layers that may include one or more potential and/or quantum wells, buffer layers, substrate layers, and superstrate layers similar to the various layers described in relation to FIGS. 1-2 and 4.

In some cases, one or both electroluminescent devices 150 and 160 can be III-V semiconductor light sources, such as III-V LEDs, and may include AlGaInN semiconductor alloys. For example, one or both electroluminescent devices 150 and 160 can be GaN based LEDs. In some cases, an emission spectrum, such as a color spectrum, of a GaN based LED can be substantially independent from the value of the input excitation signal applied to the LED. For example, in some cases, such as when first electroluminescent device 150 includes a GaN based LED, when first signal 530 changes from about 80% to about 100%, or from about 50% to about 100%, of the maximum rating of the signal, each of color coordinates $u_1'$ and $v_1'$ of light 155 at wavelength $\lambda_1$ changes by no more than 1%, or no more than 0.5%, or no more than 0.1%.

In some cases, such as when each of first and second electroluminescent devices 150 and 160 include a GaN based LED and first light converting layer 180 includes one or more II-VI potential wells, when input signal 505 changes substantially, but a ratio of first signal 530 to second signal 540 (that is, the ratio $SS_1/SS_2$) remains substantially unchanged, first color $C_o$ of output light 190 remains substantially unchanged. For example, in such cases, when $M_o$ changes from about 80% to about 100%, or from about 50% to about 100%, of the maximum rating of $M_o$; but the ratio $SS_1/SS_2$ changes by about 1% or less, or about 0.5% or less, or about 0.1% or less, or about 0.01% or less; the change $\Delta(u_o',v_o')$ in color $C_o$ is no more than 0.01, or no more than 0.005, or no more than 0.004, or no more than 0.003, or no more than 0.002, or no more than 0.001. As another example, in such cases, when $M_o$ changes from about 80% to about 100%, or from about 50% to about 100%, of the maximum rating of $M_o$ and the ratio of the first signal to the second signal changes by about 1% or less, each of CIE color coordinates $u_o'$ and $v_o'$ of color $C_o$ changes by no more than 0.01, or no more than 0.005, or no more than 0.004, or no more than 0.003, or no more than 0.002, or no more than 0.001; and the change $\Delta(u_o',v_o')$ in color $C_o$ is no more than 0.01, or no more than 0.005, or no more than 0.004, or no more than 0.003, or no more than 0.002, or no more than 0.001.

In some cases, light converting layer 180 is capable of converting at least a portion of light 165 at the second wavelength $\lambda_2$ to light 185 at the wavelength $\lambda_3$ by absorbing at least a portion of the second wavelength light and re-emitting at least a portion of the absorbed light as the third wavelength light, where the third wavelength $\lambda_3$ is longer than the second wavelength $\lambda_2$.

In some cases, first light converting layer 180 and/or light emitting system 500 have a single potential well. In some cases, first light converting layer 180 and/or light emitting system 500 include multiple potential wells. For example, in such cases, first light converting layer 180 can have at least 2 potential wells, or at least 5 potential wells, or at least 10 potential wells.

In the exemplary light emitting system 500, light absorbing layer 187 is distinct and separate from, or external to, first light absorbing layer 180. In general, light absorbing layer 187 may or may not be included in first light absorbing layer 180. For example, in some cases, first and second light absorbing layers 230 and 250 (FIG. 2) may provide the necessary absorption of light emitted by second electroluminescent device 160. As another example, in some cases, light absorbing layers 430, 450 and 460 (FIG. 4) may provide the necessary absorption of light emitted by second electroluminescent device 160.

In some cases, respective first and second electroluminescent devices 150 and 160 can have substantially identical optical and electrical characteristics. For example, in such cases, all the potential or quantum wells in LED electroluminescent devices are made of the same semiconductor alloy. For example, for blue LEDs, the potential wells are made of GaInN. As another example, all the potential or quantum wells in the LEDs have substantially the same thickness. In such cases, the variation between the thicknesses of the potential or quantum wells is no more than 50%, or no more than 40%, or no more than 30%, or no more than 20%, or no more than 10%, or no more than 5%. As yet another example, all the electroluminescent devices, such as LEDs, in light emitting system 500 are made of the same material systems using the same fabrication processes. As another example, in some cases, such as when the electroluminescent devices are LEDs, the devices have the same construction and are fabricated on the same wafer or substrate. As yet another example, the first and second LEDs may have substantially the same forward voltage for a given drive current. For example, for a given drive current, the difference between the forward voltages is no more than 10%, or no more than 5%, or no more than 1%. As another example, in cases where the same drive current is applied to the electroluminescent devices, as the drive current changes across the normal operating range of the drive current, the forward voltages remain substantially equal. In such cases, as the input current signal for the two LEDs changes across the normal operating range of the input signal, each of the respective forward voltages can change appreciably, but the difference between the forward voltages remains less than 10%, or less than 5%, or less than 1%.

In some cases, for $SS_1=SS_2$, the ratio of the output optical power of the first electroluminescent device $P_1(SS_1)$, to the output optical power of the second electroluminescent device $P_2(SS_2)$ (that is, $P_1(SS_1)/P_2(SS_2)$), is substantially independent from the drive signals $SS_1$ & $SS_2$ in a range from about 1% to about 100% of the maximum rating of the drive signal $SS_1$. For example, in such cases, as $SS_1$ changes from about 50% to about 100% of the maximum rating for $SS_1$, the ratio $P_1(SS_1)/P_2(SS_2)$ changes by no more than 10%, or no more than 5%, or no more than 1%.

FIG. 6 is a schematic light emitting system 600 that includes a first LED 650 emitting a first light 655 having a first color $C_1$ and a first intensity $I_1$ in response to an input signal 605 having a value $N_{input}$ similar to input signal $M_o$ in FIG. 5. The light emitting system also includes a first electroluminescent element 671 that includes a second LED 660 emitting a second light 665 having a second color $C_2$ and a second intensity $I_2$ in response to input signal 605, and a first light converting layer 680, similar to light converting layer 180, that can include a II-VI semiconductor material. Light converting layer 680 converts at least a portion of second light 665 to a third light 685 having a third color $C'_2$ and an intensity $I'_2$.

Light emitting system 600 outputs light 690 having an output color $C_o$ and an output intensity $I_o$ by combining first and third lights 655 and 685, respectively. In some cases, the color $C_o$ having color coordinates $u_o'$ and $v_o'$, is substantially independent from $N_{input}$. For example, in such cases, a change in $N_{input}$ from about 80% to about 100%, or from about 50% to about 100%, of the maximum rating for $N_{input}$, can result in a change in each of the CIE color coordinates $u_o'$ and $v_o'$ by no more than 0.01, or no more than 0.005, or no more than 0.004, or no more than 0.003, or no more than 0.002, or no more than 0.001; and a change $\Delta(u_o',v_o')$ in $C_o$ by no more than 0.01, or no more than 0.005, or no more than 0.004, or no more than 0.003, or no more than 0.002, or no more than 0.001.

In some cases, a change in input signal $N_{input}$ can cause a change in the output intensity $I_o$ of output light 690, but not in the output color $C_o$ of the output light. In some cases, the output intensity is substantially a linear function of the input intensity over a pre-determined, such as the normal operating, range of the input signal. In such cases, $I_o$ and $N_{input}$ substantially satisfy the equation $I_o=k_3 \cdot N_{input}$, where $k_3$ is a constant real number. In some cases, $I_o$ is a function, such as a linear function, of the input signal $N_{input}$ and the output color $C_o$ is independent from the input signal $N_{input}$.

In some cases, light emitting system 600 does not include a feedback system for adjusting the input signal $N_{input}$ for a change in output color $C_o$. In such cases, the output color $C_o$ can change without substantially affecting, such as causing a substantial change in, the input signal $N_{input}$. For example, in some cases, a change of about 10% in either of the CIE color coordinates $u_o'$ and $v_o'$ of color $C_o$ or a change $\Delta(u_o',v_o')$ of about 10% in color $C_o$, can cause a change in the magnitude of the input signal $N_{input}$ that is no more than 1%, or no more than 0.1%, or no more than 0.05%, or no more than 0.01%.

In some cases, light emitting system 600 can have one or more additional electroluminescent elements. For example, light emitting system 600 can include a second electroluminescent element 672 that includes a third LED 661 emitting a fourth light 666 having a fourth color $C_3$ and a fourth intensity $I_3$ in response to input signal 605, and a second light converting layer 681, similar to first light converting layer 180, that can include a II-VI semiconductor material. Light converting layer 681 converts at least a portion of fourth light 666 to a fifth light 686 having a fifth color $C'_3$ and a fifth intensity $I'_3$. In such cases, light emitting system 600 outputs light 690 having an output color $C_o$ and an output intensity $I_o$ by combining first, third and fifth lights 655, 685 and 686, respectively. In some cases, the color $C_o$ having CIE color coordinates $u_o'$ and $v_o'$, is substantially independent from $N_{input}$. For example, in such cases, a change in $N_{input}$ from about 80% to about 100%, or from about 50% to about 100%, of the maximum rating of $N_{input}$, can result in a change in each of $u_o'$ and $v_o'$ color coordinates by no more than 0.01, or no more than 0.005, or no more than 0.004, or no more than 0.003, or no more than 0.002, or no more than 0.001; and an a change $\Delta(u_o', v_o')$ in color Co that is no more than 0.01, or no more than 0.005, or no more than 0.004, or no more than 0.003, or no more than 0.002, or no more than 0.001.

In general, light emitting system 600 with output light 690 having output color $C_o$ and output intensity $I_o$, includes a main LED 650 that emits light at a main color and N luminescent elements where N≥1. The $i^{th}$ luminescent element, i=1 to N, includes an $i^{th}$ LED, such as a $1^{st}$ LED, emitting light at an $i^{th}$ LED color, such as a $1^{st}$ LED color; and an $i^{th}$ light converting layer, such as a $1^{st}$ light converting layer, that includes a semiconductor potential well. The $i^{th}$ light converting layer converts at least a portion of light from the $i^{th}$ LED at the $i^{th}$ LED color to light at an $i^{th}$ intermediate color, such as a $1^{st}$ intermediate color, that is different from the $i^{th}$ LED color. In some cases, the $i^{th}$ intermediate color is different than the $j^{th}$ intermediate color when i is different from j. Light emitting system 600 combines light at the main color with lights at all the $i^{th}$ intermediate colors (i=1 to N) to form output light 690 having the output color $C_o$ and CIE color coordinates $u_o'$ and $v_o$.

In some cases, light emitting system 600 has a controller, similar to controller 510 that receives input signal $N_{input}$ and outputs a main signal in response to the input signal for driving the main LED and outputs an $i^{th}$ signal, i=1 to N, in response to the input signal for driving the $i^{th}$ LED. In some cases, when the input signal $N_{input}$ changes from about 80% to about 100%, or from about 50% to about 100%, of the maximum rating of the input signal, but the ratio of the main signal to the $i^{th}$ signal remains substantially unchanged, i=1 to N, the output color of the output light remains substantially unchanged.

In some cases, the LEDs in light emitting system 600 have substantially identical optical and electrical characteristics. For example, in such cases, all the potential or quantum wells in the LEDs are made of the same semiconductor alloys and have substantially the same thickness. In such cases, the variation in the thicknesses of the potential or quantum wells is no more than 50%, or no more than 40%, or no more than 30%, or no more than 20%, or no more than 10%, or no more than 5%. As another example, all the LEDs in light emitting system 600 are made of the same material systems using the same fabrication processes. As another example, in some cases, the LEDs have the same construction and are fabricated on the same wafer or substrate. As another example, the LEDs may have substantially the same forward voltage for a given drive current.

In some cases, the ratio of the output optical power of the main LED, $P_m(N_{input})$, to the output optical power of the $i^{th}$ LED, i=1 to N, $P_i(N_{input})$, (that is, $P_m(N_{input})/P_i(N_{input})$) is substantially independent from the input signal in a range from about 50% to about 100% of the maximum rating of the input signal. For example, in such cases, as $M_o$ changes from about 80% to about 100%, or from about 50% to about 100%, of the maximum rating of $N_{input}$, the ratio $P_m(N_{input})/P_i(N_{input})$ changes by no more than 10%, or no more than 5%, or no more than 1%.

In general number N of luminescent elements can be any number that may be desirable in an application. For example, in some cases, N can be 2. In such cases and as an example, the output color $C_o$ can be white, the main color $C_1$ and each of the first and second LED colors (that is, $C_2$ and $C_3$) can be blue, the first intermediate color $C'_2$ can be green, and the second intermediate color $C'_3$ can be red.

Some of the advantages of the disclosed constructions are further illustrated by the following example. The particular materials, amounts and dimensions recited in this example, as well as other conditions and details, should not be construed to unduly limit the present invention.

Example 1

Figure 7:
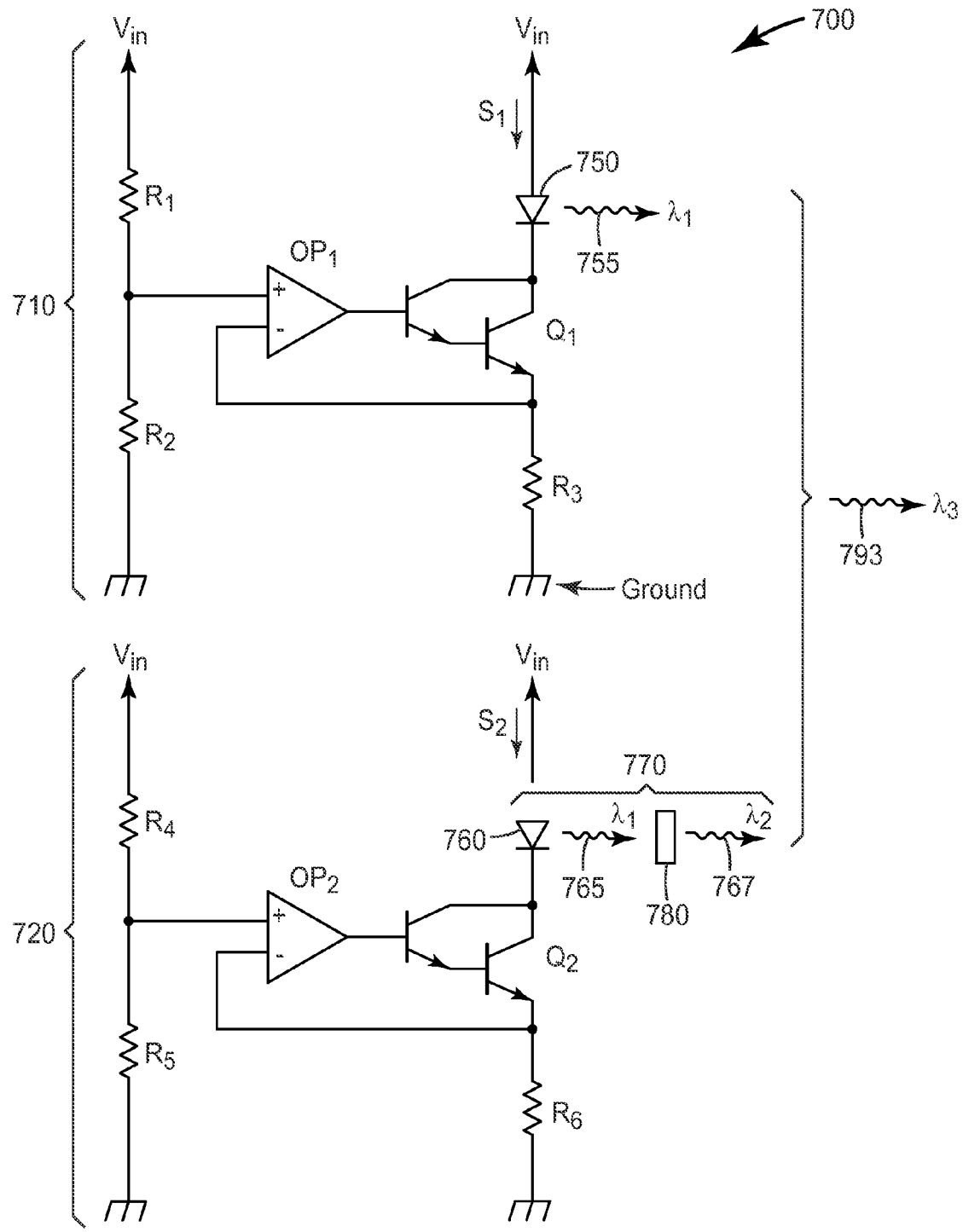
FIG. 7 is a schematic side-view of a light emitting system described in Example 1.

Light emitting system 700 shown schematically in FIG. 7 was fabricated. The fabricated light emitting system was similar to light emitting system 100 of FIG. 1. Circuit 710 for emitting light at a first wavelength $\lambda_1$ and circuit 720 for emitting light at a second wavelength $\lambda_2$ were fabricated. In circuit 710, input voltage $V_{in}$ was applied to LED 750 through operational amplifier $OP_1$, transistor $Q_1$ and resistors $R_1$=490 kΩ, $R_2$=10 kΩ and $R_3$=1Ω. The maximum rating for the input voltage $V_{in}$ was 6 volts.

In circuit 720, luminescent element 770 included LED 760 bonded to light converting layer 780. The input voltage $V_{in}$ was applied to LED 760 through operational amplifier $OP_2$, transistor $Q_2$ and resistors $R_4$=490 kΩ, $R_5$=3 kΩ and $R_6$=1Ω. The resistors, operational amplifiers and transistors were purchased from Digi-Key Corporation (Thief River Falls, Minn.).

Two blue light emitting LEDs 750 and 760 were purchased from Epistar Corporation (Hsin Chu, Taiwan). The LEDs were epitaxial AlGaInN-based LEDs bonded to silicon substrates. Some portions of the top surface of the LEDs were metalized with gold traces to spread the current and to provide pads for wire bonding. The peak emission wavelength of the LEDs 750 and 760 was $\lambda_1$=457.

A multilayer semiconductor construction was fabricated. The estimated material composition, thickness, and bulk band gap energy are summarized in Table I.

TABLE I

Details of various layers in the construction of Example 1:

| Material | Thickness (Å) | Band Gap (eV) | Description |
| --- | --- | --- | --- |
| InP | — | — | substrate |
| $Ga_{0.47}In_{0.53}As$ | 2000 | 0.77 | buffer |
| $Cd_{0.22}Mg_{0.44}Zn_{0.34}Se$ | 1000 | 2.94 | window |
| Window side: $Cd_{0.22}Mg_{0.44}Zn_{0.34}Se$ Absorber side: $Cd_{0.37}Mg_{0.23}Zn_{0.4}Se$ | 2500 | 2.94-2.52 | grading layer |
| $Cd_{0.37}Mg_{0.23}Zn_{0.4}Se$ | 1000 | 2.52 | absorber |
| $Cd_{0.73}Zn_{0.27}Se$ | 57 | 1.88 | quantum well |
| $Cd_{0.37}Mg_{0.23}Zn_{0.4}Se$ | 2000 | 2.52 | absorber |
| $Cd_{0.73}Zn_{0.27}Se$ | 57 | 1.88 | quantum well |
| $Cd_{0.37}Mg_{0.23}Zn_{0.4}Se$ | 2000 | 2.52 | absorber |
| $Cd_{0.73}Zn_{0.27}Se$ | 57 | 1.88 | quantum well |
| $Cd_{0.37}Mg_{0.23}Zn_{0.4}Se$ | 2000 | 2.52 | absorber |
| $Cd_{0.73}Zn_{0.27}Se$ | 57 | 1.88 | quantum well |
| $Cd_{0.37}Mg_{0.23}Zn_{0.4}Se$ | 1000 | 2.52 | absorber |
| Absorber side: $Cd_{0.37}Mg_{0.23}Zn_{0.4}Se$ Window side: $Cd_{0.22}Mg_{0.44}Zn_{0.34}Se$ | 2500 | 2.52-2.94 | grading layer |
| $Cd_{0.22}Mg_{0.44}Zn_{0.34}Se$ | 1000 | 2.94 | window |

A GaInAs buffer layer was first grown on an InP substrate by molecular beam epitaxy (MBE) to prepare the surface for subsequent II-VI growth. The coated substrate was then moved through an ultra-high vacuum transfer system to another MBE chamber for growth of different II-VI epitaxial layers. The multilayer semiconductor construction included four CdZnSe quantum wells. Each quantum well was similar to potential well 240 and had a bulk energy gap ($E_g$) of about 1.88 eV. Each quantum well was sandwiched between two CdMgZnSe light absorbing layers similar to light absorbing layers 230 and 250. The light absorbing layers had energy gaps of about 2.52 eV and were capable of strongly absorbing blue light at 457 nm. The multilayer semiconductor construction further included two windows similar to windows 220 and 260. The multilayer semiconductor construction further included two grading layers, each between a window and a light absorbing layer. The material composition of the grading layers gradually changed from the material composition of the light absorbing layer on the light absorbing side to the material composition of the window on the window side.

Next, the window side of the multilayer semiconductor construction was bonded to the emission or top surface of LED 760 using Norland optical adhesive 83H from Norland Products, Inc. (Cranbury, N.J.). The thickness of the bonding adhesive layer was in the range from about 1 μm to about 10 μm.

The InP substrate was next removed with a solution of $3HCl:1H_2O$. The etchant stopped at the GaInAs buffer layer. The buffer layer was subsequently removed in an agitated solution of 30 ml ammonium hydroxide (30% by weight), 5 ml hydrogen peroxide (30% by weight), 40 g adipic acid, and 200 ml water, leaving only the II-VI converting layer 780 adhesively attached to LED 760.

Vias were then etched through the converting layer and the adhesive bonding layer in order to make electrical contact to the gold coated portions of the top surface of the LED. The vias were made using conventional contact photolithography using a negative photoresist (NR7-1000PY, Futurrex, Franklin, N.J.). In making the vias, the II-VI layers in the converting layer were etched by immersing the construction for about 10 minutes in HCl (30% by weight) mixed with 10 parts $H_2O$ by volume and saturated with Br. The adhesive bonding layer and the patterned photoresist were subsequently etched by exposing the construction to an oxygen plasma at a pressure of 200 mTorr and an RF power of 200 W for 20 minutes in a plasma reactive ion etching system from Oxford Instruments (Oxfordshire, UK) resulting in luminescent element 770 in FIG. 7. Light converting layer 780 converted light 765 at $\lambda_1$=457 nm to light 767 at $\lambda_2$=634 nm.

Output light 793 of light emitting system 700 was the combination of lights 755 at $\lambda_1$=457 nm and 767 at $\lambda_2$=634. The value of input voltage $V_{in}$ was changed from 6 volts to 4.75 volts. In each case, the values of current $S_1$ flowing through LED 750, current $S_2$ flowing through 760, and color coordinates u' and v' of output light 793 were measured. The results are summarized in Table II.

TABLE II

Parameters of system 700 for different values of input voltage $V_{in}$

| $V_{in}$ (volts) | $S_1$ (mA) | $S_2$ (mA) | $S_1/S_2$ | u' | v' |
|---|---|---|---|---|---|
| 6.0 | 112.4 | 35.0 | 3.211 | 0.1950 | 0.1739 |
| 4.75 | 89.8 | 27.8 | 3.230 | 0.1966 | 0.1720 |

When input voltage $V_{in}$ was changed from 6.0 volts or about 100% of the maximum rating of the input voltage to 4.75 volts or about 79% of the maximum rating of the input voltage, the u' color coordinate of output light 793 changed from 0.1950 to 0.1966 or a change of Δu'=0.0016 and the v' color coordinate of the output light changed from 0.1739 to 0.1720 or a change of Δu'=−0.0019, resulting in a change Δ(u',v') of 0.0025. Furthermore, current $S_1$ changed by about 20.1%, current $S_2$ changed by about 20.6%, but the current ratio $S_1/S_2$ changed by only about 0.59%.

As used herein, terms such as "vertical", "horizontal", "above", "below", "left", "right", "upper" and "lower", "top" and "bottom" and other similar terms, refer to relative positions as shown in the figures. In general, a physical embodiment can have a different orientation, and in that case, the terms are intended to refer to relative positions modified to the actual orientation of the device. For example, even if the construction in FIG. 2 is flipped as compared to the orientation in the figure, first absorbing layer 230 is still considered to be on "top" of potential well or re-emitting layer 240.

While specific examples of the invention are described in detail above to facilitate explanation of various aspects of the invention, it should be understood that the intention is not to limit the invention to the specifics of the examples. Rather, the intention is to cover all modifications, embodiments, and alternatives falling within the spirit and scope of the invention as defined by the appended claims.

What is claimed is:

1. A light emitting system emitting an output light having a first color, the system comprising:
   a first electroluminescent device emitting light at a first wavelength in response to a first signal, the first wavelength being substantially independent of the first signal and an intensity of the emitted first wavelength light being substantially proportional to the first signal; and
   a first luminescent element comprising a second electroluminescent device and a first light converting layer, wherein:
   the second electroluminescent device emits light at a second wavelength in response to a second signal; and wherein:
   the first light converting layer comprises a semiconductor potential well and converts at least a portion of light at the second wavelength to light at a third wavelength longer than the second wavelength;
   wherein the light emitting system combines light at the first wavelength with light at the third wavelength to form the output light having the first color, and wherein when one of the first and second signals changes from about 50% of a maximum rating of the signal to about 100% of the maximum rating, but a ratio of the first signal to the second signal remains substantially unchanged, the first color of the output light remains substantially unchanged.

2. The light emitting system of claim 1, wherein the second wavelength is substantially independent of the second signal.

3. The light emitting system of claim 1, wherein an intensity of the emitted second wavelength light is substantially proportional to the second signal.

4. The light emitting system of claim 1, wherein at least one of the first and second electroluminescent devices is an LED.

5. The light emitting system of claim 4, wherein the LED is a III-V LED.

6. The light emitting system of claim 1, wherein each of the first and second electroluminescent devices comprises at least one potential well, and wherein each potential well in the first and second electroluminescent devices comprises a same semiconductor alloy.

7. The light emitting system of claim 6, wherein each potential well in the first and second electroluminescent devices has a same thickness.

8. The light emitting system of claim 6, wherein each potential well in the first and second electroluminescent devices comprises GaInN.

9. The light emitting system of claim 8, wherein each potential well in the first and second electroluminescent devices is immediately adjacent a layer comprising GaN.

10. The light emitting system of claim 1, wherein the potential well in the first light converting layer comprises a II-VI compound.

11. The light emitting system of claim 10, wherein the potential well in the first light converting layer comprises Cd(Mg)ZnSe or ZnSeTe.

12. The light emitting system of claim 1, wherein the first wavelength is substantially equal to the second wavelength.

13. The light emitting system of claim 1, wherein at least one of the first and second wavelengths is blue.

14. The light emitting system of claim 1, wherein the third wavelength is green or red.

15. The light emitting system of claim 1, wherein the first and second electroluminescent devices have substantially identical optical and electrical characteristics.

16. The light emitting system of claim 1, wherein a 10% change in the first signal results in a 1% or less change in the first wavelength.

17. The light emitting system of claim 1, wherein the intensity of the emitted first wavelength is $k_1$ times the first signal, $k_1$ being a constant real number.

18. The light emitting system of claim 1, wherein a 10% change in the second signal results in a 1% or less change in the second wavelength.

19. The light emitting system of claim 1, wherein the intensity of the emitted second wavelength is $k_2$ times the second signal, $k_2$ being a constant real number.

20. The light emitting system of claim 1, wherein the first light converting layer converts substantially all of light at the second wavelength to light at the third wavelength.

21. The light emitting system of claim 20, wherein the first light converting layer converts at least 50% of light at the second wavelength to light at the third wavelength.

22. The light emitting system of claim 20, wherein the first light converting layer converts at least 70% of light at the second wavelength to light at the third wavelength.

23. The light emitting system of claim 20, wherein the first light converting layer converts at least 90% of light at the second wavelength to light at the third wavelength.

24. The light emitting system of claim 1, wherein a substantial portion of any unconverted second wavelength light is absorbed by the light emitting system.

25. The light emitting system of claim 24, wherein at least 50% of the unconverted second wavelength light is absorbed by the light emitting system.

26. The light emitting system of claim 24, wherein at least 70% of the unconverted second wavelength light is absorbed by the light emitting system.

27. The light emitting system of claim 24, wherein at least 90% of the unconverted second wavelength light is absorbed by the light emitting system.

28. The light emitting system of claim 1, wherein the first color is one of green, yellow, amber, red, and white.

29. The light emitting system of claim 1, wherein the first and second signals originate from a same control signal.

30. The light emitting system of claim 29, wherein when the control signal changes substantially but a ratio of the first signal to the second signal remains substantially unchanged, the first color of the output light remains substantially unchanged.

31. The light emitting system of claim 30, wherein when the control signal changes by about 10% and the ratio of the first signal to the second signal changes by about 1% or less, each of an u' and v' color coordinates of the first color changes by no more than 0.003.

32. The light emitting system of claim 1 further comprising a second luminescent element comprising a third electroluminescent device and a second light converting layer, wherein:
the third electroluminescent device emits light at a fourth wavelength in response to a third signal; and wherein:
the second light converting layer comprises a semiconductor potential well and converts at least a portion of light at the fourth wavelength to light at a fifth wavelength longer than the second wavelength;
wherein the light emitting system combines light at the first, third and fifth wavelengths to form the output light having the first color, and wherein when one of the first, second, and third signals changes from about 50% of a maximum rating of the signal to about 100% of the maximum rating, but a ratio of the first signal to the second signal remains substantially unchanged and a ratio of the first signal to the third signal remains substantially unchanged, the first color of the output light remains substantially unchanged.

33. The light emitting system of claim 32, wherein the fourth wavelength is substantially equal to the first wavelength.

34. The light emitting system of claim 32, wherein each of the first, second and third electroluminescent devices comprises at least one potential well, and wherein each potential well in the first, second and third electroluminescent devices comprises a same semiconductor alloy.

35. The light emitting system of claim 34, wherein each potential well in the first, second and third electroluminescent devices has a same thickness.

36. A light emitting system emitting an output light having a first color, the system comprising:
a first electroluminescent device emitting light at a first wavelength;
a first luminescent element comprising:
a second electroluminescent device emitting light at a second wavelength; and
a first light converting layer comprising a semiconductor potential well and converting at least a portion of light at the second wavelength to light at a longer third wavelength, the light emitting system combining light at the first and third wavelengths to form the output light having the first color; and
a controller receiving an input signal and outputting a first signal in response to the control signal for driving the first electroluminescent device and outputting a second signal in response to the control signal for driving the second electroluminescent device, wherein when the control signal changes from about 50% to about 100% of a maximum rating of the control signal but a ratio of the first signal to the second signal remains substantially unchanged, the first color of the output light remains substantially unchanged.

37. The light emitting system of claim 36, wherein a ratio of an output optical power of the first electroluminescent device to an output optical power of the second electroluminescent device is substantially independent from the control signal in a range from about 50% to about 100% of the maximum rating of the control signal.

38. The light emitting system of claim 36, wherein at least one of the first and second electroluminescent devices is an LED.

39. The light emitting system of claim 38, wherein the LED is a III-V LED.

40. The light emitting system of claim 36, wherein the potential well comprises a II-VI compound.

41. The light emitting system of claim 40, wherein the semiconductor potential well in the first light converting layer comprises Cd(Mg)ZnSe or ZnSeTe.

42. The light emitting system of claim 36, wherein the first wavelength is substantially equal to the second wavelength.

43. The light emitting system of claim 36, wherein at least one of the first and second wavelengths is UV or blue.

44. The light emitting system of claim 36, wherein the third wavelength is green, yellow, amber or red.

45. The light emitting system of claim 36, wherein the first and second electroluminescent devices have substantially identical optical and electrical characteristics.

46. The light emitting system of claim 36, wherein a 10% change in the first signal results in a 1% or less change in the first wavelength.

47. The light emitting system of claim 36, wherein the intensity of the emitted first wavelength is $k_1$ times the first signal, $k_1$ being a constant real number.

48. The light emitting system of claim 36, wherein a 10% change in the second signal results in a 1% or less change in the second wavelength.

49. The light emitting system of claim 36, wherein the intensity of the emitted second wavelength is $k_2$ times the second signal, $k_2$ being a constant real number.

50. The light emitting system of claim 36, wherein the first light converting layer converts substantially all of light at the second wavelength to light at the third wavelength.

51. The light emitting system of claim 50, wherein the first light converting layer converts at least 50% of light at the second wavelength to light at the third wavelength.

52. The light emitting system of claim 50, wherein the first light converting layer converts at least 70% of light at the second wavelength to light at the third wavelength.

53. The light emitting system of claim 50, wherein the first light converting layer converts at least 90% of light at the second wavelength to light at the third wavelength.

54. The light emitting system of claim 36, wherein a substantial portion of any unconverted second wavelength light is absorbed by the light emitting system.

55. The light emitting system of claim 54, wherein at least 50% of the unconverted second wavelength light is absorbed by the light emitting system.

56. The light emitting system of claim 54, wherein at least 70% of the unconverted second wavelength light is absorbed by the light emitting system.

57. The light emitting system of claim 54, wherein at least 90% of the unconverted second wavelength light is absorbed by the light emitting system.

58. The light emitting system of claim 36, wherein the first color is one of green, yellow, amber, red and white.

59. The light emitting system of claim 36, wherein the first and second signals originate from a same control signal.

60. The light emitting system of claim 59, wherein when the control signal changes from about 50% to about 100% of a maximum rating of the control signal but a ratio of the first signal to the second signal remains substantially unchanged, the first color of the output light remains substantially unchanged.

61. The light emitting system of claim 60, wherein when the control signal changes from about 50% to about 100% and the ratio of the first signal to the second signal changes by about 1% or less, each of an x and y color coordinates of the first color changes by no more than 0.003.

62. A light emitting system, comprising:
a first LED emitting a first light having a first color in response to an input signal; and
a second LED emitting a second light having a second color in response to the input signal; and
a light converting layer comprising a II-VI semiconductor potential well and converting at least a portion of the second light to a third light having a third color, wherein the light emitting system outputs light having an output color and an output intensity by combining the first and third lights, and wherein a change in the input signal changes the output intensity, but not the output color.

63. The light emitting system of claim 62, wherein each of the first and second LEDs comprises at least one potential well, and wherein each potential well in the first and second LEDs comprises a same semiconductor alloy.

64. The light emitting system of claim 63, wherein each potential well in the first and second LEDs has a same thickness.

65. The light emitting system of claim 62, wherein a change in the output color does not cause a change in the input signal.

66. A light emitting system comprising:
a first luminescent element emitting a first light at a first wavelength $\lambda_1$ in response to a first signal $S_1$; and
a second luminescent element comprising:
a first electroluminescent device emitting a second light at a second wavelength $\lambda_2$ different than $\lambda_1$ in response to a second signal $S_2$; and
a first light converting layer comprising a semiconductor potential well and converting a portion of the second light to a third light at a third wavelength $\lambda_3$ different than $\lambda_1$ and $\lambda_2$, and transmitting a portion of the second light as a fourth light at $\lambda_2$;
wherein the light emitting system combines first, third and fourth lights to form an output light having a first color $C_o$, and wherein when one of $S_1$ and $S_2$ signals changes from about 50% of a maximum rating of the signal to about 100% of the maximum rating, but the ratio $S_1/S_2$ remains substantially unchanged, the first color $C_o$ remains substantially unchanged.

67. The light emitting system of claim 66, wherein the first luminescent element comprises:
a second electroluminescent device emitting a fifth light at a fourth wavelength $\lambda_4$ in response to the second signal $S_2$; and
a second light converting layer comprising a semiconductor potential well and converting at least a portion of the fifth light to the first light at the first wavelength $\lambda_1$.

68. The light emitting system of claim 67, wherein each of wavelengths $\lambda_2$ and $\lambda_4$ corresponds to a blue light.

69. The light emitting system of claim 67, wherein a difference between $\lambda_2$ and $\lambda_4$ is no more than 70 nm.

70. The light emitting system of claim 67, wherein a difference between $\lambda_2$ and $\lambda_4$ is no more than 50 nm.

71. The light emitting system of claim 67, wherein a difference between $\lambda_2$ and $\lambda_4$ is no more than 30 nm.

72. The light emitting system of claim 67, wherein a difference between $\lambda_2$ and $\lambda_4$ is no more than 10 nm.

73. The light emitting system of claim 66, wherein the output spectrum of the first luminescent element is centered at the first wavelength $\lambda_1$.

74. The light emitting system of claim 66, wherein the first electroluminescent device is an LED.

75. The light emitting system of claim 66, wherein $\lambda_1$ corresponds to a green light, $\lambda_2$ corresponds to a blue light, $\lambda_3$ corresponds to a red light, and the first color $C_o$ corresponds to a white light.

76. The light emitting system of claim 66, wherein when one of $S_1$ and $S_2$ signals changes from about 50% of a maximum rating of the signal to about 100% of the maximum rating, the ratio $S_1/S_2$ changes by about 3% or less, and the change $\Delta(u',v')$ in $C_o$ is no more than 0.003, u' and v' being color coordinates of color $C_o$.

* * * * *